US009995805B2

(12) United States Patent
Ando

(10) Patent No.: US 9,995,805 B2
(45) Date of Patent: Jun. 12, 2018

(54) MAGNETIC FIELD HOMOGENEITY ADJUSTMENT METHOD, MAGNET DEVICE, AND MAGNETIC RESONANCE IMAGING APPARATUS

(71) Applicant: Hitachi, Ltd., Tokyo (JP)

(72) Inventor: Ryuya Ando, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 968 days.

(21) Appl. No.: 14/379,587

(22) PCT Filed: Feb. 20, 2013

(86) PCT No.: PCT/JP2013/054219
§ 371 (c)(1),
(2) Date: Aug. 19, 2014

(87) PCT Pub. No.: WO2013/145959
PCT Pub. Date: Oct. 3, 2013

(65) Prior Publication Data
US 2015/0008923 A1 Jan. 8, 2015

(30) Foreign Application Priority Data
Mar. 29, 2012 (JP) .................................. 2012-077368

(51) Int. Cl.
*G01V 3/00* (2006.01)
*G01R 33/387* (2006.01)
(Continued)

(52) U.S. Cl.
CPC ......... *G01R 33/387* (2013.01); *G01R 33/381* (2013.01); *G01R 33/3873* (2013.01);
(Continued)

(58) Field of Classification Search
CPC .................................................. G01R 33/387
(Continued)

(56) References Cited

U.S. PATENT DOCUMENTS 8,947,089 B2 * 2/2015 Abe .................. G01R 33/3873
324/301
9,778,334 B2 * 10/2017 Mallet ................ G01R 33/3873
(Continued)

FOREIGN PATENT DOCUMENTS

JP 2002-177243 A 6/2002
JP 2004-081395 A 3/2004
(Continued)

*Primary Examiner* — Louis Arana
(74) *Attorney, Agent, or Firm* — Mattingly & Malur, PC

(57) ABSTRACT

A computer executes: calculating a first volume distribution (v.d.) of magnetic materials on a shim tray, based on a first magnetic field strength distribution (m.f.s.d.) in a magnetic field space (S3); acquiring a first composite distribution (c.d.) representing a volume by addition of volumes of magnetic materials for each region of the shim tray, and positions of the regions (S5); calculating a virtual m.f.s.d. created by magnetic materials supposed to be arranged as in the first c.d. (S8); calculating a second m.f.s.d. by addition of the first m.f.s.d. and the virtual m.f.s.d. (S9); calculating a second v.d. of magnetic materials on the shim tray, based on the second m.f.s.d. (S3); acquiring a second c.d. representing a volume by addition of volumes of magnetic materials for each region, and positions of the regions (S5); and displaying the positions of regions and the volumes in the first c.d. and second c.d. (S10).

15 Claims, 16 Drawing Sheets

(51) Int. Cl.
  *G01R 33/3873* (2006.01)
  *G01R 33/381* (2006.01)
  *G01R 33/56* (2006.01)
  *G01R 33/565* (2006.01)
  G01R 33/38 (2006.01)
  G01R 33/3815 (2006.01)

(52) U.S. Cl.
  CPC ....... *G01R 33/565* (2013.01); *G01R 33/5608* (2013.01); *G01R 33/3806* (2013.01); *G01R 33/3815* (2013.01)

(58) Field of Classification Search
  USPC .................................... 324/320, 319, 318
  See application file for complete search history.

(56) References Cited

U.S. PATENT DOCUMENTS

| | | | |
|---|---|---|---|
| 2002/0043975 A1 | 4/2002 | Aoki | |
| 2004/0036472 A1 | 2/2004 | Goto | |
| 2008/0204018 A1* | 8/2008 | Dewdney | G01R 33/3875 324/309 |
| 2011/0057655 A1 | 3/2011 | Ando et al. | |
| 2011/0089943 A1 | 4/2011 | Abe et al. | |
| 2012/0268119 A1 | 10/2012 | Abe et al. | |
| 2014/0009152 A1* | 1/2014 | Sakakibara | G01R 33/3873 324/307 |

FOREIGN PATENT DOCUMENTS

| | | |
|---|---|---|
| JP | 2009-268791 A | 11/2009 |
| WO | 2009/136642 A1 | 11/2009 |

* cited by examiner

FIG.4
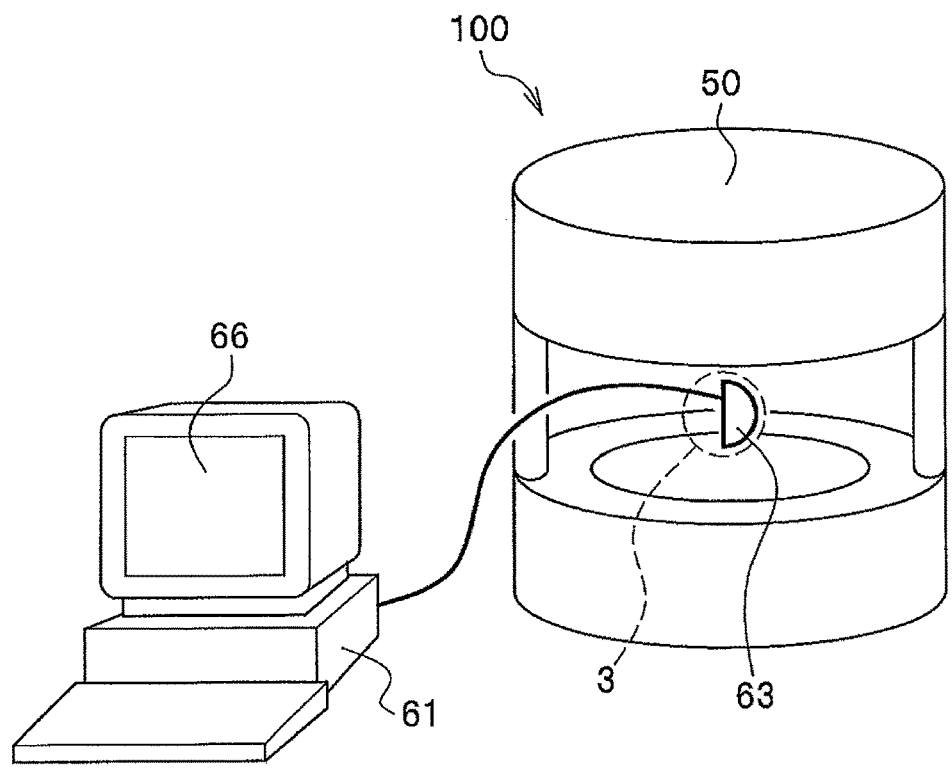
MAGNETIC FIELD ANALYSIS DATA
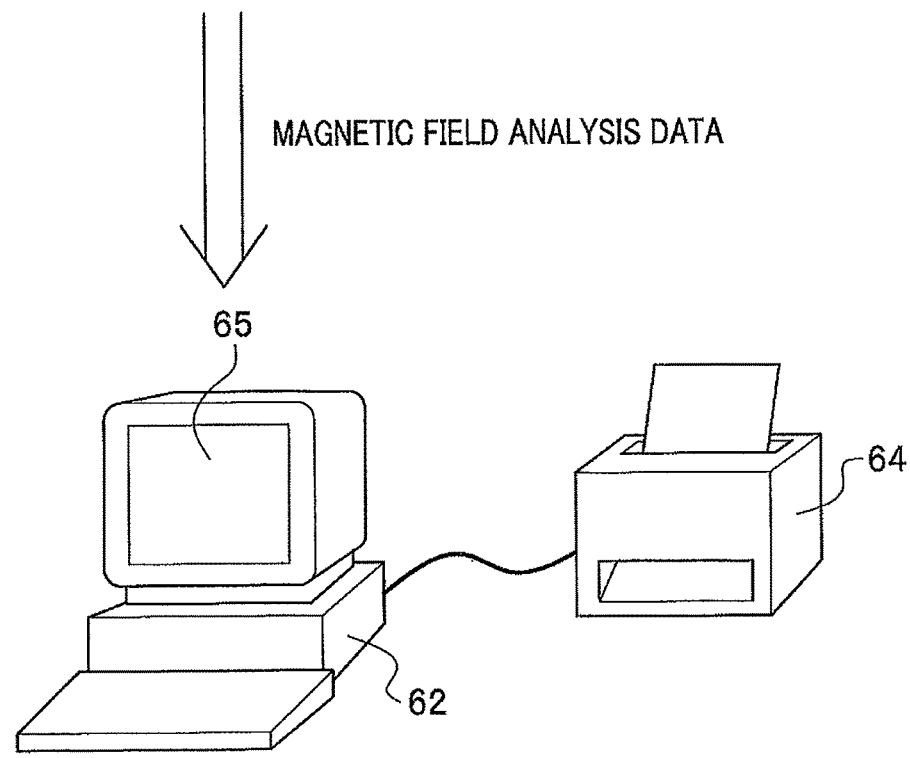

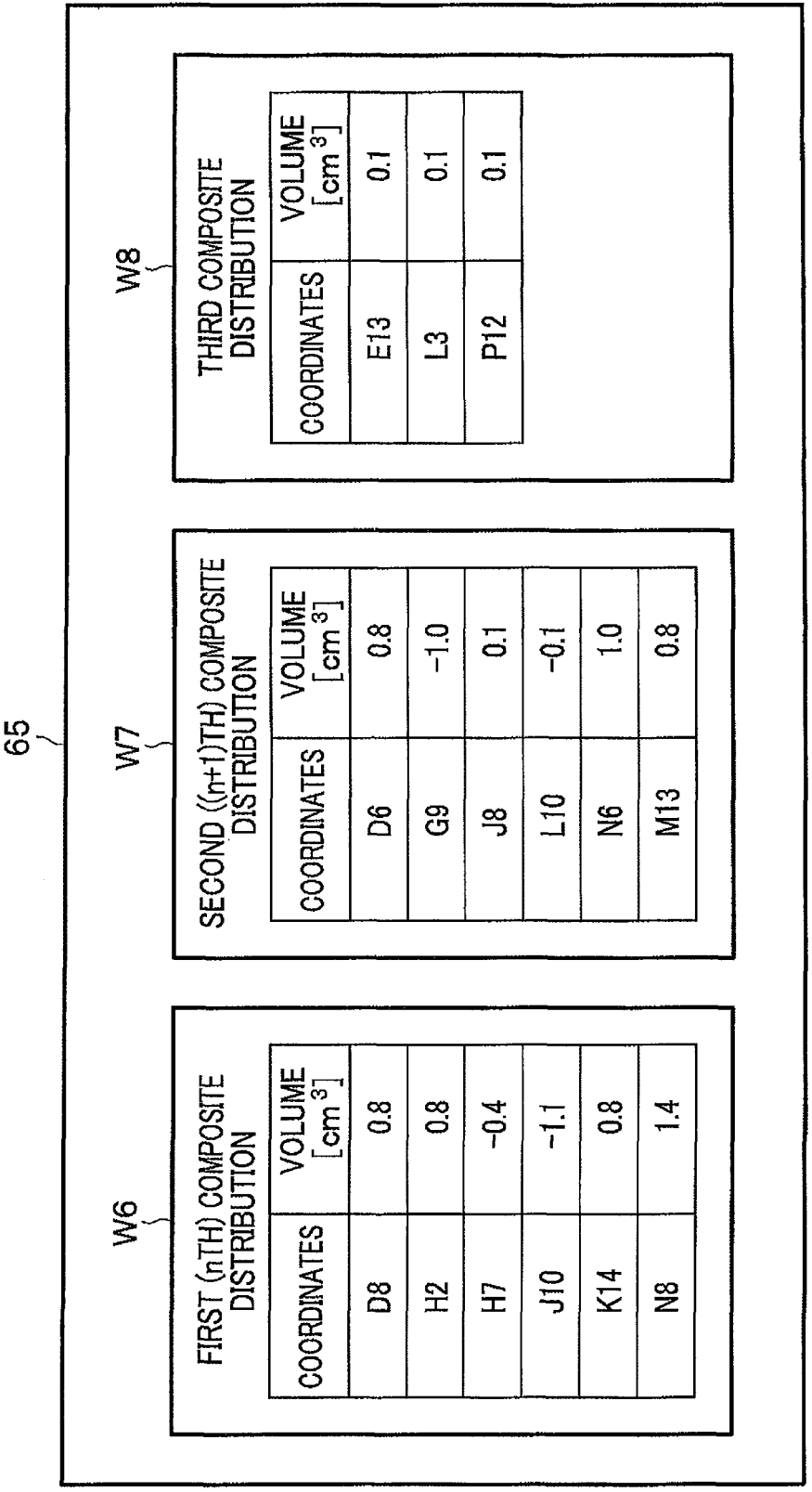

MAGNETIC FIELD HOMOGENEITY ADJUSTMENT METHOD, MAGNET DEVICE, AND MAGNETIC RESONANCE IMAGING APPARATUS

TECHNICAL FIELD

The present invention relates to a magnetic field homogeneity adjustment method, a magnet device, and a magnetic resonance imaging apparatus for adjusting magnetic field homogeneity of a magnetic field generated by a magnetic field generation source.

BACKGROUND ART

A magnetic resonance imaging (MRI) apparatus can obtain images representing physical and chemical properties of a subject by utilizing a nuclear magnetic resonance phenomenon which occurs when the subject (object to be examined) placed in a homogeneous static magnetic field space is irradiated with a radio-frequency pulse, and is used particularly for medical purposes. The magnetic resonance imaging apparatus mainly includes a magnet device for generating a homogeneous static magnetic field in an imaging region (a magnetic field space) in which a subject is carried, a radio frequency (RF) coil which irradiates the imaging region with a radio-frequency pulse, a receiving coil which receives a response from the imaging region, and a gradient magnetic field coil which generates a gradient magnetic field for providing position information on a resonance phenomenon into the imaging region.

In the magnetic resonance imaging apparatus, one of requirements for improving the image quality is to improve static magnetic field homogeneity in the imaging region. Therefore, the magnet device for generating a static magnetic field is subjected to magnetic field homogeneity adjustments in steps of design, fabrication (assembly) and installation. Among these adjustments, the magnetic field homogeneity adjustment in the installation step is performed for example by adjusting a magnetic field inhomogeneity component caused by a fabrication error, ambient environment or the like by adding or removing a magnetic material (magnetic material shim) to or from the magnet device. Matters as to at which position and what amount of the magnetic material shims are arranged can be generalized as optimization matters having magnetic field homogeneity in the imaging space as an objective function. In other words, the arrangement of magnetic material shims can be determined by a linear optimization method or its improved approach or the like by using a given magnetic field distribution in the imaging space.

Patent Literature 1 discloses a method in which, in order to improve work efficiency for the arrangement of magnetic material shims determined by these methods, for each position at which a volume distribution of magnetic material shims to be arranged has a local maximum value or local minimum value, magnetic material shims having volumes obtained by multiplying volume distributions in a region around the position are arranged, and thereby, the number of magnetic material shims to be arranged is significantly reduced.

CITATION LIST

Patent Literature

Patent Literature 1: Japanese Patent Application Publication No. 2009-268791

SUMMARY OF INVENTION

Technical Problem

As described in Patent Literature 1, for each position at which a volume distribution of magnetic material shims has a local maximum value or local minimum value, magnetic material shims having volumes obtained by multiplying volume distributions in a region around the position are arranged, and thereby, it is not necessary to arrange the magnetic material shims in order to strictly implement the determined volume distribution of the magnetic material shims on a shim tray, and the number of magnetic material shims to be arranged can be significantly reduced, and thus, the time required for magnetic field homogeneity adjustment of adding or removing the magnetic material shims on the shim tray can be reduced.

However, magnetic material shims corresponding to a volume distribution of magnetic material shims which does not belong to the region around the position at which the volume distribution of magnetic material shims has the local maximum value or local minimum value are not arranged, and thus, the magnetic field homogeneity adjustment of adding or removing the magnetic material shims on the shim tray may not be finished with a single operation. Therefore, it is useful if the number of magnetic material shims to be added or removed on the shim tray in the magnetic field homogeneity adjustment can be reduced and the number of magnetic field homogeneity adjustments can also be reduced.

In other words, an object of the present invention is to provide a magnetic field homogeneity adjustment method, a magnet device and a magnetic resonance imaging apparatus capable of reducing the number of magnetic material shims to be added or removed in magnetic field homogeneity adjustment and also reducing the number of magnetic field homogeneity adjustments.

Solution to Problem

To solve the above problems, the present invention includes calculating a first volume distribution of magnetic materials on a shim tray, based on a first magnetic field strength distribution in a magnetic field space; acquiring a first composite distribution representing a volume obtained by adding together the volumes of the magnetic materials in each of regions of the shim tray in the first volume distribution, and the positions of the regions; calculating a virtual magnetic field strength distribution created in the magnetic field space by the magnetic materials supposed to be arranged as in the first composite distribution; calculating a second magnetic field strength distribution obtained by adding together the first magnetic field strength distribution and the virtual magnetic field strength distribution; calculating a second volume distribution of the magnetic materials on the shim tray, based on the second magnetic field strength distribution; acquiring a second composite distribution representing a volume obtained by adding together the volumes of the magnetic materials in each of the regions in the second volume distribution, and the positions of the regions; and displaying the positions of the regions and the volumes of the magnetic materials in the first composite distribution and the second composite distribution, respectively.

Advantageous Effects of Invention

According to the present invention, it is possible to provide a magnetic field homogeneity adjustment method, a magnet device and a magnetic resonance imaging apparatus capable of reducing the number of magnetic material shims to be added or removed in magnetic field homogeneity adjustment and also reducing the number of magnetic field homogeneity adjustments.

BRIEF DESCRIPTION OF DRAWINGS

FIG. 4 is a connection diagram of a magnetic field homogeneity adjustment device which implements a magnetic field homogeneity adjustment method according to the first embodiment of the present invention, and its peripheral devices.

FIG. 11 illustrates a screen of a display device which displays together plural windows which display plural first to second ((n+1)th) composite distributions in a magnetic field homogeneity adjustment method according to a second embodiment of the present invention.

DESCRIPTION OF EMBODIMENTS

Figure 1:
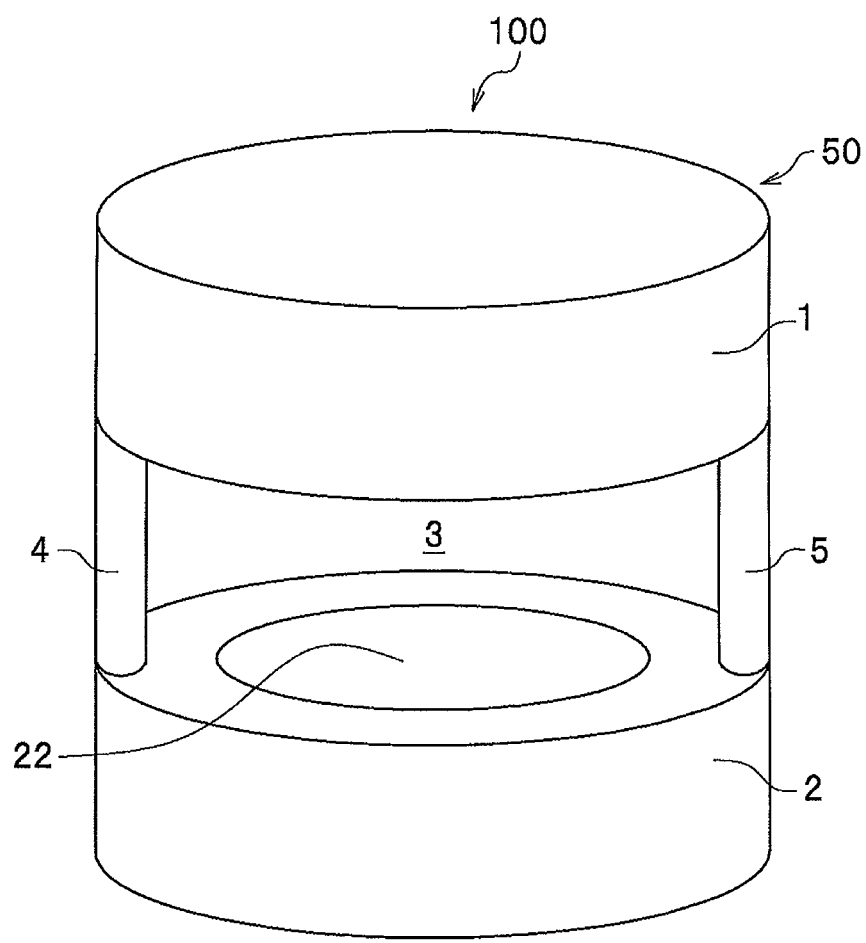
FIG. 1 is a perspective view of a magnetic resonance imaging apparatus according to a first embodiment of the present invention.

Next, embodiments of the present invention will be described in detail with reference to the drawings as appropriate. Incidentally, in the drawings; common portions are indicated by the same reference numerals, and repeated description will be omitted.

(First Embodiment)

FIG. 1 illustrates a perspective view of a magnetic resonance imaging apparatus 100 according to a first embodiment of the present invention. The magnetic resonance imaging apparatus 100 includes a magnet device 50 which generates a magnetic field space 3. The magnet device 50 includes a pair of upper and lower coil containers 1, 2, and connecting columns 4, 5 supporting the pair of upper and lower coil containers 1, 2 facing each other. The magnetic field space 3 in which a static magnetic field having a vertical direction and homogeneous strength is generated is formed between the pair of upper and lower coil containers 1, 2. In the magnetic resonance imaging apparatus 100, a subject (an object to be examined) is placed in the magnetic field space 3. The magnetic resonance imaging apparatus 100 includes an RF transmitting and receiving coil 22 which irradiates the magnetic field space 3 (the subject) with a radio-frequency pulse. The RF transmitting and receiving coil 22 receives a signal caused by a nuclear magnetic resonance phenomenon which occurs when the subject (the object to be examined) is irradiated with the radio-frequency pulse. The magnetic resonance imaging apparatus 100 can obtain images representing physical and chemical properties of the subject, based on the signal.

Figure 2:
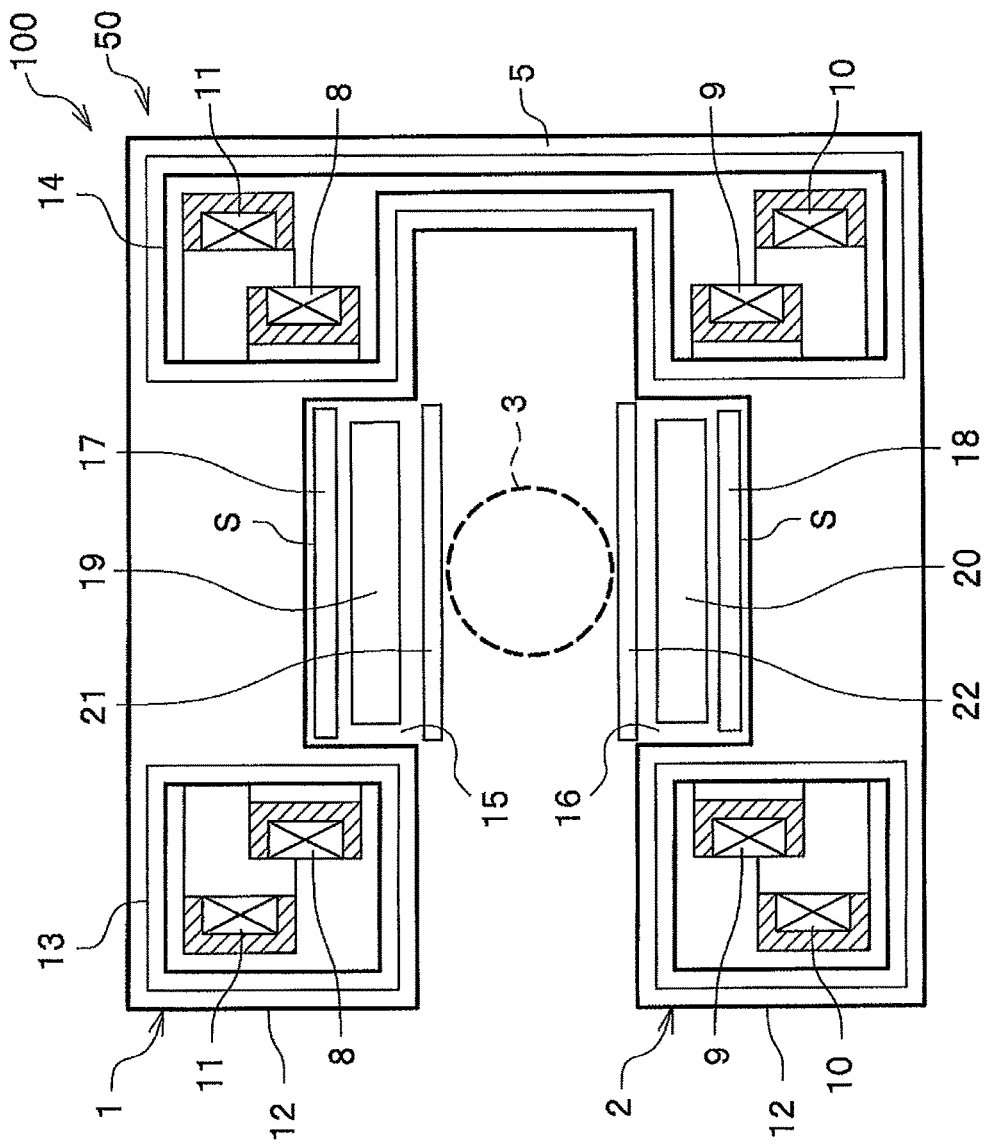
FIG. 2 is a longitudinal sectional view of the magnetic resonance imaging apparatus according to the first embodiment of the present invention.

FIG. 2 illustrates a longitudinal sectional view of the magnetic resonance imaging apparatus 100 according to the first embodiment of the present invention. The magnetic resonance imaging apparatus 100 includes the magnet device 50 and the RF transmitting and receiving coils 21, 22, and, in addition, gradient magnetic field coils 19, 20 which generate a gradient magnetic field in order to provide position information on the nuclear magnetic resonance phenomenon occurring in the magnetic field space 3, and shim trays 17, 18 which are used as magnetic field homogeneity adjustment means to improve magnetic field homogeneity in the magnetic field space 3.

The upper coil container 1 of the magnet device 50 houses a main coil 8 which is formed in a circular ring shape and is a superconducting coil, and a shielding coil 11. The lower coil container 2 of the magnet device 50 houses a main coil 9 formed in a circular ring shape and being a superconducting coil, and a shielding coil 10. The main coils 8, 9 and the shielding coils 10, 11 act as a magnetic field generation source which generates the magnetic field space 3. The strength of a magnetic field generated in the magnetic field space 3 by the main coils 8, 9 and the shielding coils 10, 11 is substantially homogeneous, and the magnetic field space 3 acts as an imaging space of the magnetic resonance imaging apparatus 100. The main coils 8, 9 form mainly a static magnetic field having homogeneous strength and a vertical direction in the magnetic field space 3. This may be due to the fact that magnetic poles (magnetic pole faces) S are formed in the insides of the main coils 8, 9. The shielding coils 10, 11 suppress the leakage of the magnetic field formed by the main coils 8, 9 to the outside.

The upper coil container 1 includes a vacuum container 12 formed in a substantially cylindrical shape, a radiation shield 13 housed in the vacuum container 12, and a helium container 14 housed in the radiation shield 13. The helium container 14 thus insulated from heat houses the main coil 8 and the shielding coil 11 together with liquid helium as a coolant for the superconducting coil, and is cooled. A configuration of the lower coil container 2 is the same as that of the upper coil container 1.

As described above, the main coils 8, 9 and the shielding coils 10, 11 are configured to homogenize the magnetic field in the magnetic field space 3; to improve the homogeneity, a ferromagnetic material (not illustrated) such as iron or a permanent magnet may be arranged inside or outside the vacuum container 12, inside the radiation shield 13, or inside the helium container 14. Moreover, in an example of FIG. 2, the main coils 8, 9 and the shielding coils 10, 11 are illustrated as being provided two each; however, the numbers of main coils and shielding coils are not so limited, and it is obvious that any number of main coils and shielding coils may be provided. Thus, the magnet device 50 is designed and manufactured to homogenize the magnetic field strength in the magnetic field space 3; however, actually, an error magnetic field component is produced relative to a homogeneous magnetic field component in the magnetic field space 3 by the influence of a fabrication error or an installation environment. The shim trays 17, 18 are provided to act as the magnetic field homogeneity adjustment means in order to remove the error magnetic field component and improve the magnetic field homogeneity in the magnetic field space 3.

Recessed portions 15, 16 are formed in surfaces of the coil containers 1, 2 facing each other with the magnetic field space 3 in between. The recessed portions 15, 16 internally house the shim trays 17, 18 made of a nonmagnetic material, the gradient magnetic field coils 19, 20, and the RF transmitting and receiving coils 21, 22. The shim trays 17, 18 are arranged in the rearmost parts of the recessed portions 15, 16, the gradient magnetic field coils 19, 20 are arranged in the shim trays 17, 18 on the sides thereof close to the magnetic field space 3, and the RF transmitting and receiving coils 21, 22 are arranged in the gradient magnetic field coils 19, 20 on the sides thereof close to the magnetic field space 3. The gradient magnetic field coils 19, 20 and the RF transmitting and receiving coils 21, 22 are installed attachably and detachably and can expose the shim trays 17, 18 and can perform magnetic field homogeneity adjustment involving addition or removal of magnetic material shims to or from the shim trays 17, 18. Incidentally, the shim trays 17, 18 may be attachable and detachable or may be unattachable and undetachable.

Figure 3A:
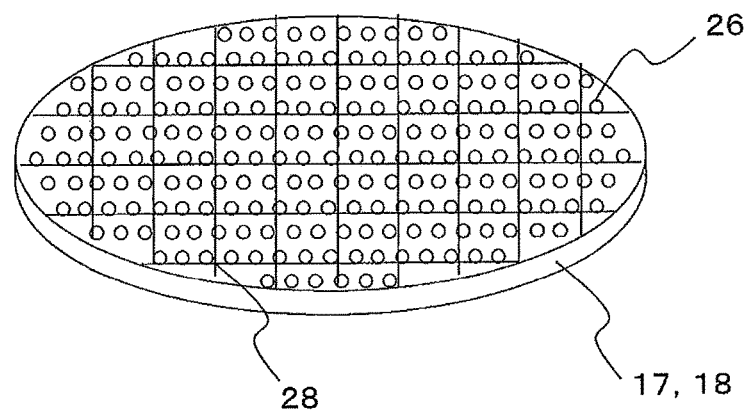
FIG. 3A is a perspective view of a shim tray (magnetic field homogeneity adjustment means).
Figure 3B:
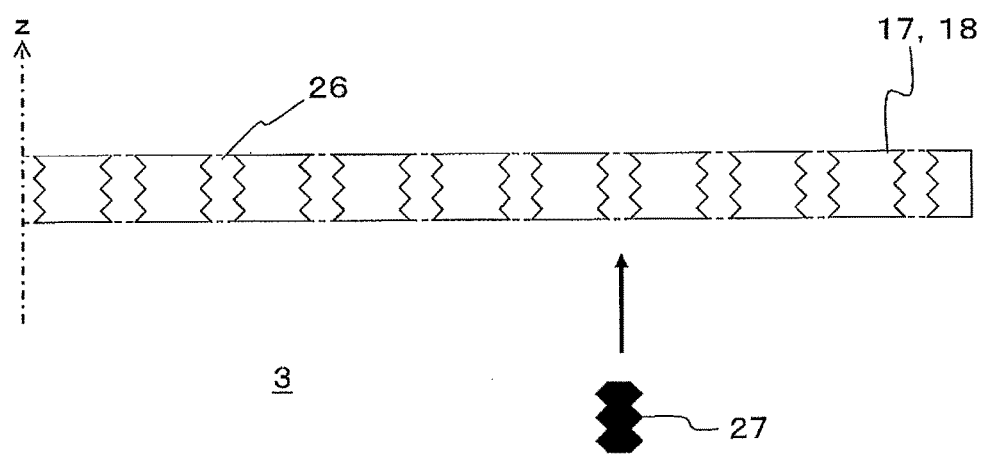
FIG. 3B is a portion of a longitudinal sectional view of the shim tray (magnetic field homogeneity adjustment means).

FIG. 3A illustrates a perspective view of the shim tray (magnetic field homogeneity adjustment means) 17 (18), and FIG. 3B illustrates a portion of a longitudinal sectional view of the shim tray 17 (18). As illustrated in FIG. 3A, the shim tray 17 (18) has a disc shape, and FIG. 3B illustrates a cross section containing a central axis z of the shim tray 17 (18) on one side of the central axis z. As illustrated in FIGS. 3A and 3B, the shim tray 17 (18) has many screw holes 26 formed therein. At the time of magnetic field homogeneity adjustment, shim bolts 27 (magnetic field homogeneity adjustment means) as screw-shaped magnetic material shims are screwed and fixed into the screw holes 26. The shim bolts 27 are prepared by varying net volumes of magnetic materials according to their lengths or processing method, and an operator of the magnetic field homogeneity adjustment selects the shim bolt 27 having a necessary volume as appropriate for each of the screw holes 26 to screw the shim bolt 27 into each of the screw holes 26. Incidentally, as illustrated in FIG. 3A, (orthogonal) grids 28 are formed on surfaces of the shim trays 17, 18. The grids 28 divide the surfaces of the shim trays 17, 18 into plural regions. The plural screw holes 26 are contained in each of the regions. Incidentally, in an example of FIG. 3B, the screw-shaped shim bolts 27 are used as the magnetic materials (shims); however, the magnetic materials are not so limited, anything may be used, provided that the magnetic materials can be added and fixed to the shim trays 17, 18, or the magnetic materials can be fixed and a certain magnetic material can be removed, and the advantageous effects of the present invention are not lost even if the magnetic materials have any shape such as a columnar shape, a conical shape, a plate shape or a rivet shape.

The magnetic field homogeneity adjustment is an operation for arranging the shim bolts 27 having the volumes required to obtain a homogeneous magnetic field in the screw holes 26 provided at positions required to obtain the homogeneous magnetic field. At which positions the shim bolts 27 are to be arranged on the shim trays 17, 18 and what volumes of the shim bolts 27 are to be arranged in order to obtain the homogeneous magnetic field can be calculated by a computer 62 (see FIG. 4) having magnetic field homogeneity adjustment software installed therein, based on a measured value of a magnetic field strength distribution in the magnetic field space 3. Incidentally, the volumes of the shim bolts 27 may be read as weights (masses) thereof. Moreover, the volumes of the shim bolts 27 may be read as the volumes of the magnetic materials or the weights of the magnetic materials. In other words, a volume distribution or the like to be described later may be read as a weight distribution or the like.

FIG. 4 illustrates a connection diagram of the computer (magnetic field homogeneity adjustment device) which implements a magnetic field homogeneity adjustment method according to the first embodiment of the present invention, and its peripheral devices (such as an output device 64). A magnetic probe 63 is arranged in the magnetic field space (imaging space) 3 of the magnet device 50 (magnetic resonance imaging apparatus 100) and detects a first magnetic field strength distribution in the magnetic field space 3. The magnetic probe 63 is connected to a data acquisition calculator 61, and the data acquisition calculator 61 acquires the detected first magnetic field strength distribution. The data acquisition calculator 61 is a computer having a data acquisition program installed therein and can receive and store input of the first magnetic field strength distribution in a predetermined form. Moreover, the data acquisition calculator 61 can display the first magnetic field strength distribution in a predetermined form on a display device 66. The data acquisition calculator 61 transmits the first magnetic field strength distribution (magnetic field analysis data) to the computer 62 (magnetic field homogeneity adjustment device) or does the like to cause the computer 62 (magnetic field homogeneity adjustment device) to store the first magnetic field strength distribution. The computer 62 (magnetic field homogeneity adjustment device) has the magnetic field homogeneity adjustment software installed therein. The computer 62 (magnetic field homogeneity adjustment device) can calculate at which positions the shim bolts 27 are to be arranged on the shim trays 17, 18 and what volumes of the shim bolts 27 are to be arranged, and can display calculated results on a display device 65 or output the calculated results to the output device 64, by executing algorithms of the magnetic field homogeneity adjustment software. Incidentally, in an example of FIG. 4, the data acquisition calculator 61 and the computer 62 (magnetic field homogeneity adjustment device) are illustrated as being different computers; however, the single computer 62 may also serve as the data acquisition calculator and the magnetic field homogeneity adjustment device, since, provided that data acquisition software and the magnetic field homogeneity adjustment software each can operate, this will do.

Figure 5:
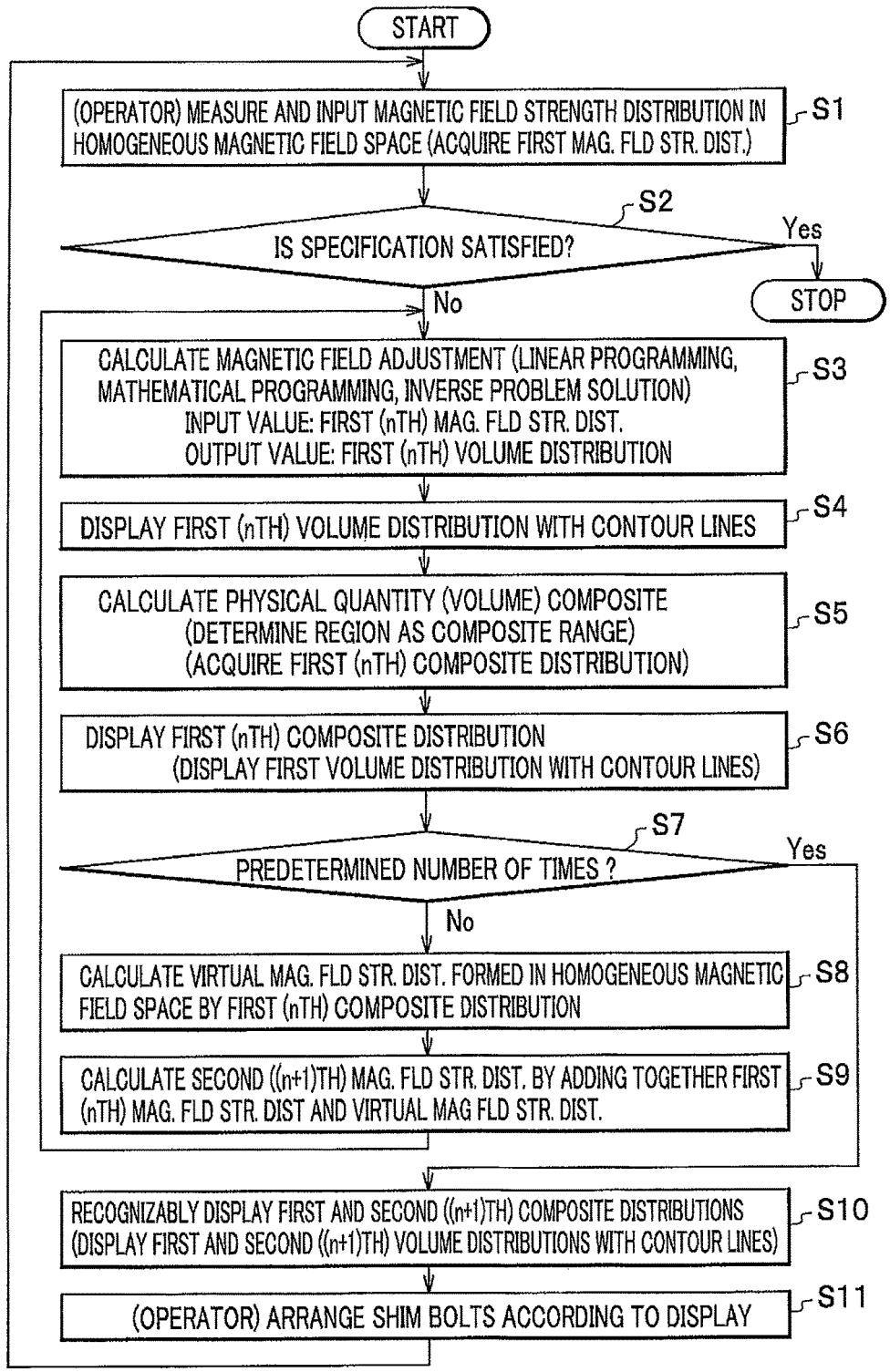
FIG. 5 is a flowchart of the magnetic field homogeneity adjustment method according to the first embodiment of the present invention.

FIG. 5 illustrates a flowchart of the magnetic field homogeneity adjustment method according to the first embodiment of the present invention.

First, at step S1, the data acquisition calculator 61 or the operator uses the magnetic probe 63 to measure magnetic field strengths at plural positions in the magnetic field space 3. In other words, a magnetic field strength distribution (first magnetic field strength distribution) is measured in the magnetic field space 3. A measured result is inputted to the computer 62 (magnetic field homogeneity adjustment device). The computer 62 (magnetic field homogeneity adjustment device) can acquire the first magnetic field strength distribution and stores the first magnetic field strength distribution.

Then, at step S2, the computer 62 determines whether or not the first magnetic field strength distribution satisfies a homogeneous magnetic field specification. Specifically, homogeneity in the magnetic field space 3 is calculated from the first magnetic field strength distribution, and a determination is made as to whether or not the homogeneity is more than a predetermined homogeneity (specification). If the first magnetic field strength distribution satisfies the homogeneous magnetic field specification (Yes at step S2), the flowchart is brought to an end. If the first magnetic field strength distribution does not satisfy the homogeneous magnetic field specification (No at step S2), the processing proceeds to step S3.

At step S3, the computer 62 performs magnetic field adjustment calculation. Specifically, a first (nth) volume distribution indicating the positions and volumes of the shim bolts (magnetic materials) 27 to be arranged on the shim trays 17, 18 is calculated as an output value, based on the first (nth) magnetic field strength distribution as an input value, in order to homogenize the first magnetic field strength distribution.

The magnetic field adjustment calculation is installed as software in the computer 62. An algorithm of the magnetic field adjustment calculation may be, for example, mathematical programming such as known linear programming or other optimization approaches, or inverse problem solution such as solves an inverse problem, and any approach may be used. In the first embodiment, an algorithm using the reverse programming solution is given as an example.

Figure 6:
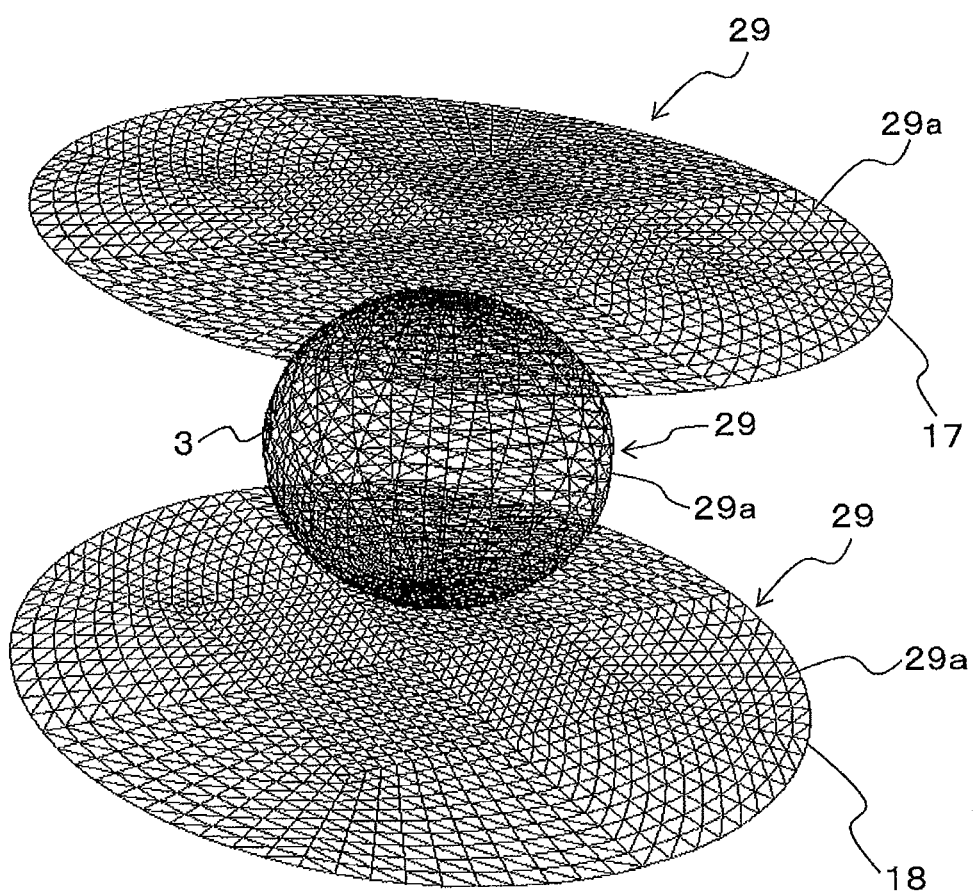
FIG. 6 is a perspective view of an example of computational grids for calculating a first volume distribution of shim bolts (magnetic materials), corresponding to a magnet device according to the first embodiment of the present invention.

First, as illustrated in FIG. 6, the shim trays 17, 18 and the magnetic field space 3 are represented by computational grids 29. Nodes 29a of the computational grids 29 of the shim trays 17, 18 may coincide with the positions of the screw holes 26 formed in the shim trays 17, 18, or are not limited to coinciding therewith. Meanwhile, the nodes 29a of the computational grids 29 of the magnetic field space 3 are brought into coincidence with the positions (measured positions) in the magnetic field space 3 at which the magnetic field strength is actually measured at step S1.

When the shim bolt 27 having a volume $V_i$ and magnetization M is arranged at a certain node i (29a, the screw hole 26) on the computational grid 29 of each of the shim trays 17, 18, magnetic field strength B(i, j) which the shim bolt 27 forms at a certain node j (29a, the measured position) on the computational grid 29 in the magnetic field space 3 is proportional to the volume $V_i$ and the magnetization M, as represented by Equation (1), where $m_i$ denotes a magnetic dipole moment.

$$B(i,j) \propto V_i M = m_i \qquad (1)$$

Here, the magnetization M is set constant. Therefore, a distribution (magnetic moment distribution) of the magnetic moments $m_i$ of the shim bolts 27 arranged at the nodes 29a on the computational grids 29 of the shim trays 17, 18 can be expressed as Equation (2).

$$\vec{m} = \begin{pmatrix} m_1 \\ m_2 \\ \vdots \\ m_n \end{pmatrix} \qquad (2)$$

Moreover, by using the distribution of the magnetic moments $m_i$, a distribution (magnetic field distribution) of magnetic field strengths B(i, j) formed at the nodes j (29a) on the computational grid 29 in the magnetic field space 3 can be expressed as Equation (3).

$$\vec{b} = \begin{pmatrix} b_1 \\ b_2 \\ \vdots \\ b_l \end{pmatrix} \qquad (3)$$

Then, a relationship between the magnetic field distribution (Equation (3)) and the magnetic moment distribution (Equation (2)) can be expressed as Equation (4) with a coefficient matrix replaced with A.

$$\vec{b} = A\vec{m} \qquad (4)$$

When singular value decomposition is applied to the coefficient matrix A, a pseudo-inverse A' of the coefficient matrix A can be obtained. Thereby, Equation (4) can be rewritten as Equation (5). Incidentally, the singular value decomposition is described in detail for example in Haruo Yanai et al., "Projection Matrix, Generalized Matrix, Singular Value Decomposition," UP Applied Mathematics Library 10, 1983.

$$\vec{m} = A'\vec{b} \qquad (5)$$

Thus, when the target magnetic field distribution (Equation (3)) (to be generated) is determined, a matrix product with the pseudo-inverse A' is calculated by Equation (5), and thereby, the necessary magnetic moment distribution (Equation (2)) can be calculated. When this is applied to the magnetic field homogeneity adjustment, the magnetic field in the magnetic field space 3 can become homogeneous by adding the target magnetic field distribution (Equation (3)) (to be generated) to the magnetic field distribution (first magnetic field strength distribution) already generated by the main coils 8, 9 or the like; In other words, when the target homogeneous magnetic field distribution in the magnetic field space 3 is represented as Equation (6) and the measured value (first magnetic field strength distribution) of the magnetic field distribution in the magnetic field space 3 before the adjustment is represented as Equation (7), the target magnetic field distribution (Equation (3)) (to be generated) can be calculated as represented by Equation (8).

$$\vec{b}_u \qquad (6)$$

$$\vec{b}_m \qquad (7)$$

$$\vec{b} = \vec{b}_u - \vec{b}_m \qquad (8)$$

When Equation (8) is substituted into Equation (5) to obtain the magnetic moment distribution (Equation (2)), the volume $V_i$ of the shim bolt 27 corresponding to each magnetic moment $m_i$ can be calculated by using Equation (9) obtained by transforming Equation (1).

$$V_i = \frac{m_i}{M} \qquad (9)$$

After the above, step S3 ends to complete calculation of the volumes of the shim bolts (magnetic materials) 27 to be arranged at the positions of the screw holes 26 of the shim trays 17, 18. Consequently, the first (nth) volume distribution indicating the positions and volumes of the shim bolts (magnetic materials) 27 is calculated as the output value.

Figure 7A:
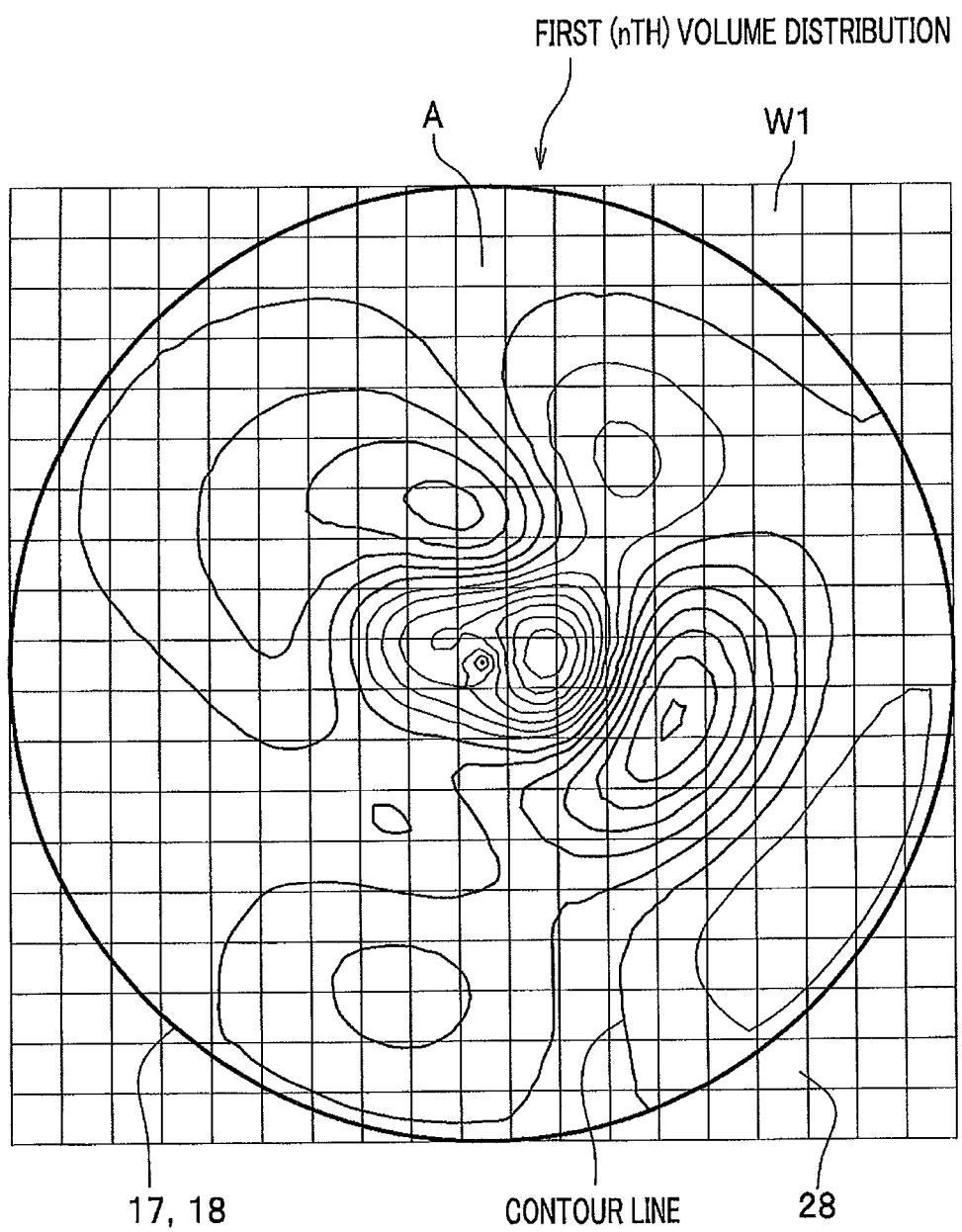
FIG. 7A illustrates a window which displays the first (nth) volume distribution.

Then, at step S4 of FIG. 5, the computer 62 displays the first (nth) volume distribution as illustrated in FIG. 7A on the display device 65 or outputs the first (nth) volume distribution to the output device 64. When the first (nth) volume distribution is displayed on the display device 65, a multi-window is provided on a screen of the display device 65, the first (nth) volume distribution is displayed on one window W1 of the multi-window. Contour lines are used to display the first (nth) volume distribution. The first (nth) volume distribution is superimposed and displayed on displays of a contour line of the shim tray 17 (18) and the (orthogonal) grid 28 formed on the surface of the shim tray 17 (18).

Figure 7B:
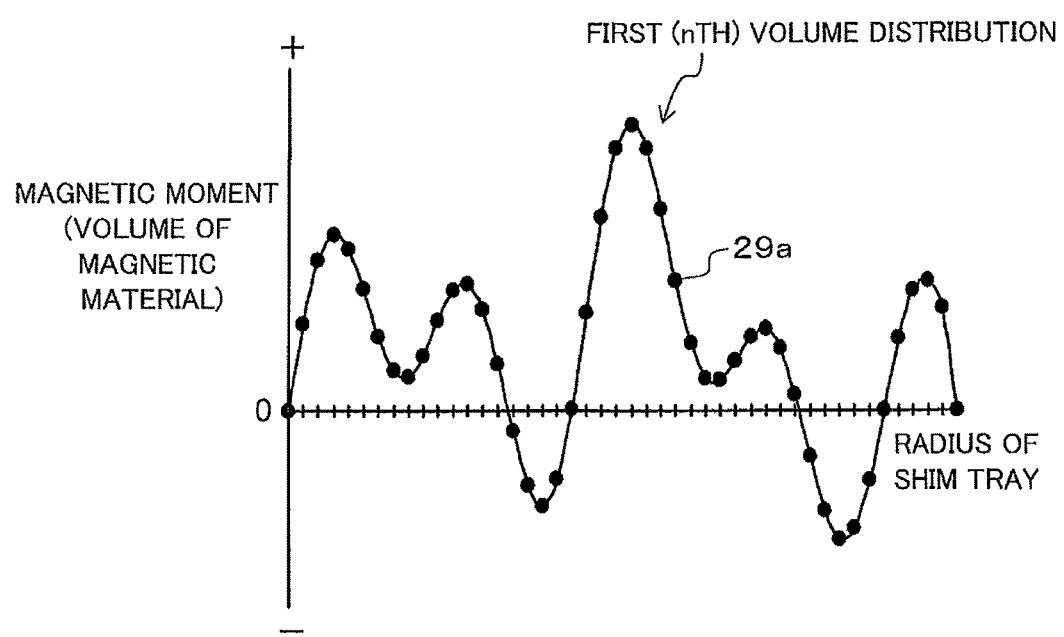
FIG. 7B illustrates the first (nth) volume distribution on a radius of the shim tray.

FIG. 7B illustrates the first (nth) volume distribution on a radius of the shim tray 17 (18). The volume (magnetic moment $m_i$) of the shim bolt (magnetic material) 27 is calculated and displayed for each of the nodes 29a. Here, the positive value of the volume (magnetic moment $m_i$) of the shim bolt (magnetic material) 27 along a vertical axis refers to the magnetic moment having the same direction as the direction of the magnetic field of the magnet device 50, and means that the shim bolt (magnetic material) 27 is added to the shim tray 17 (18). The negative value thereof refers to the magnetic moment having the opposite direction to the direction of the magnetic field of the magnet device 50, and means that the shim bolt (magnetic material) 27 is removed from the shim tray 17 (18).

Then, at step S5 of FIG. 5, the computer 62 performs physical quantity (volume) composite calculation. Since arrangement of the shim bolts 27 having corresponding volumes at all of the nodes 29a, or the screw holes 26, on the shim tray 17 (18) requires a large amount of operation, the physical quantity (volume) composite calculation is performed in order to reduce the amount of operation. The physical quantity (volume) composite calculation includes (1) first determining a region as a composite range, and (2) then obtaining an in-region volume by adding together the volumes of the shim bolts 27 corresponding to the nodes 29a (screw holes 26) present in each region. Then, a first (nth) composite distribution indicating the position and the in-region volume for each region is obtained.

Specifically, in (1) determining the region as the composite range, a region A divided by the (orthogonal) grids 28 illustrated in FIG. 7A can be determined as the region as the composite range.

In (2) obtaining the first (nth) composite distribution, an added value $m_A$ obtained by adding together the magnetic moments $m_i$ is calculated for each region A. The added value $m_A$ is represented as Equation (10).

$$m_A = \Sigma_{i \in A} m_i \qquad (10)$$

For each region A, an in-region volume $V_A$ of the shim bolts 27 to be arranged in the region A can be calculated by using Equation (11).

$$V_A = \frac{m_A}{M} \qquad (11)$$

After the above, step S5 ends to complete calculation of the in-region volume $V_A$ of the shim bolts (magnetic materials) 27 to be arranged at the positions in each region A of the shim trays 17, 18. Consequently, the first (nth) volume distribution indicating the position and the in-region volume $V_A$ for each region A is calculated.

Figure 8A:
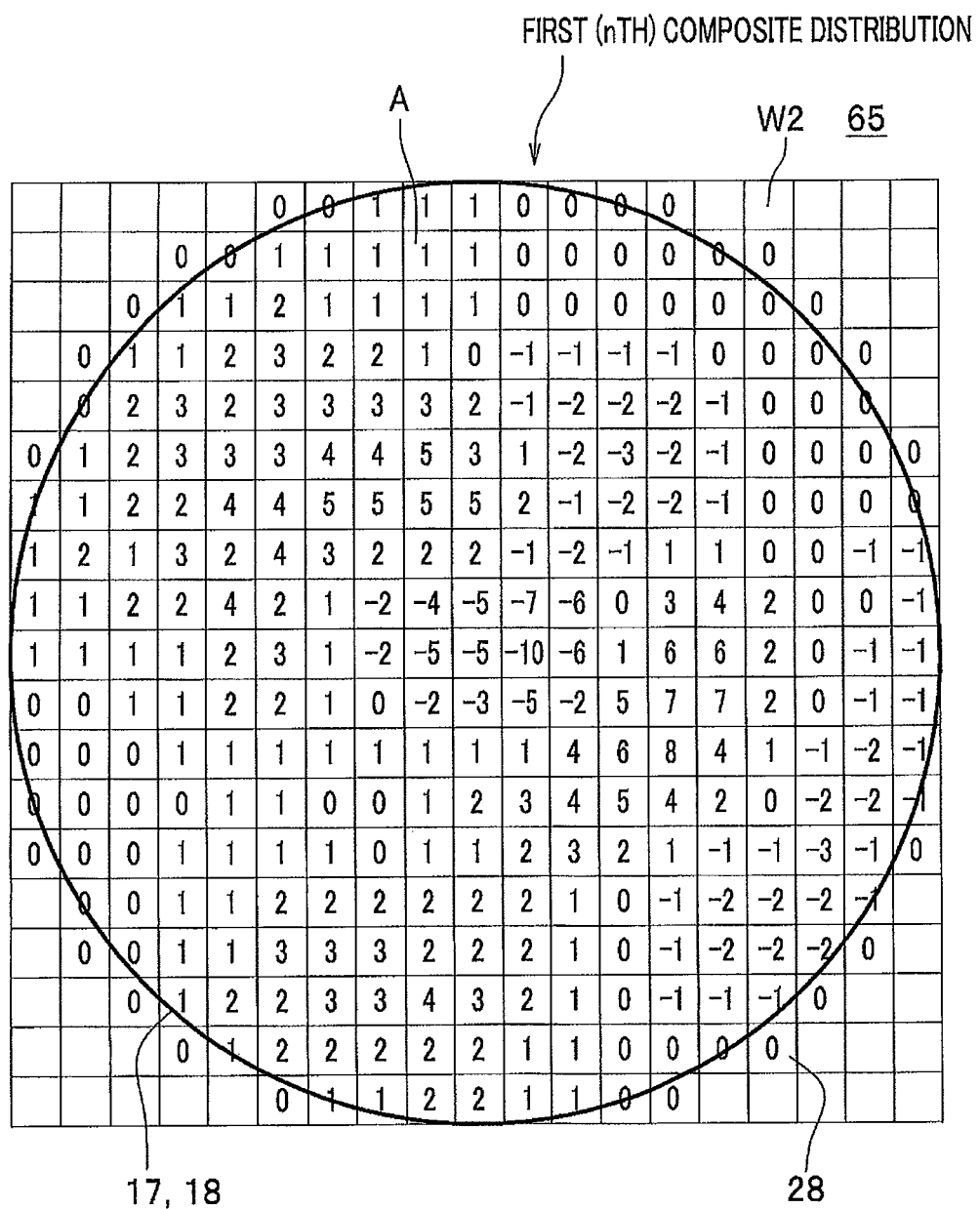
FIG. 8A illustrates a window which displays the first (nth) composite distribution.
Figure 8B:
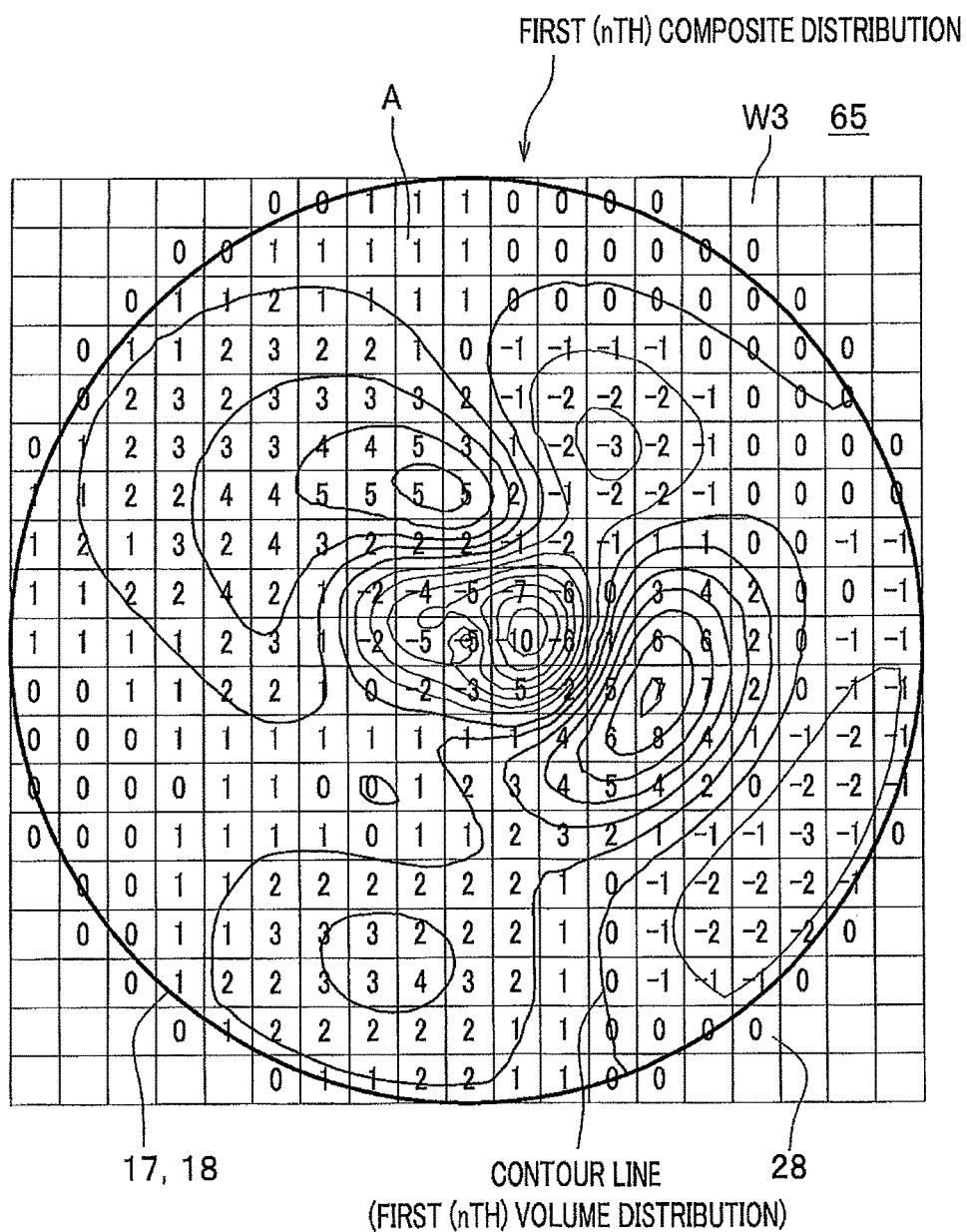
FIG. 8B illustrates a window which superimposes and displays the first (nth) volume distribution and the first (nth) composite distribution.

Then, at step S6, the computer 62 displays the first (nth) composite distribution as illustrated in FIG. 8A on the display device 65 or outputs the first (nth) composite distribution to the output device 64. When the first (nth) composite distribution is displayed on the display device 65, a multi-window is provided on the screen of the display device 65, the first (nth) composite distribution is displayed on one window W2 of the multi-window. The first (nth) composite distribution is represented by superimposing and displaying the in-region volume $V_A$ of the corresponding region A on display of the region A divided by the (orthogonal) grid 28. Moreover, the first (nth) composite distribution and the region A divided by the (orthogonal) grid 28 are superimposed and displayed on display of contour lines. Further, as illustrated in FIG. 8B, the first (nth) volume distribution illustrated in FIG. 7A may be superimposed and displayed. Superimposition of the first (nth) composite distribution and the first (nth) volume distribution as illustrated in FIG. 8B is displayed on one window W3 of the multi-window on the screen of the display device 65. The windows W1 to W3 can be selectively displayed or be displayed side by side.

The unit of numerical values of the in-region volume $V_A$ described in the region A of FIG. 8A is a unit representing a volume, such for example as cubic centimeters. The size of the orthogonal grid 28 is appropriately predetermined to have sufficient performance for magnetic field homogeneity adjustment, and the orthogonal grid 28 has a dimension of 50 mm square. In steps S5 and S6, the shim bolts 27 having the in-region volume $V_A$ are arranged in all regions A, and thus, the number of regions A is smaller than the number of screw holes 26, and thus, the amount of operation can be reduced as compared to the arrangement of the shim bolts 27 in all screw holes 26.

Moreover, the amount of operation can be further reduced by modifying step S5 in the following manner.

The physical quantity (volume) composite calculation of step S5 includes (1) first determining a region A as a composite range, and (2) then obtaining an in-region volume $V_A$ calculated by adding together the volumes $V_i$ of the shim bolts 27 corresponding to the nodes 29a (screw holes 26) present in each region A, and a first (nth) composite distribution indicating the position for each region A. This modification modifies a method for determining the region A as the composite range.

Figure 9A:
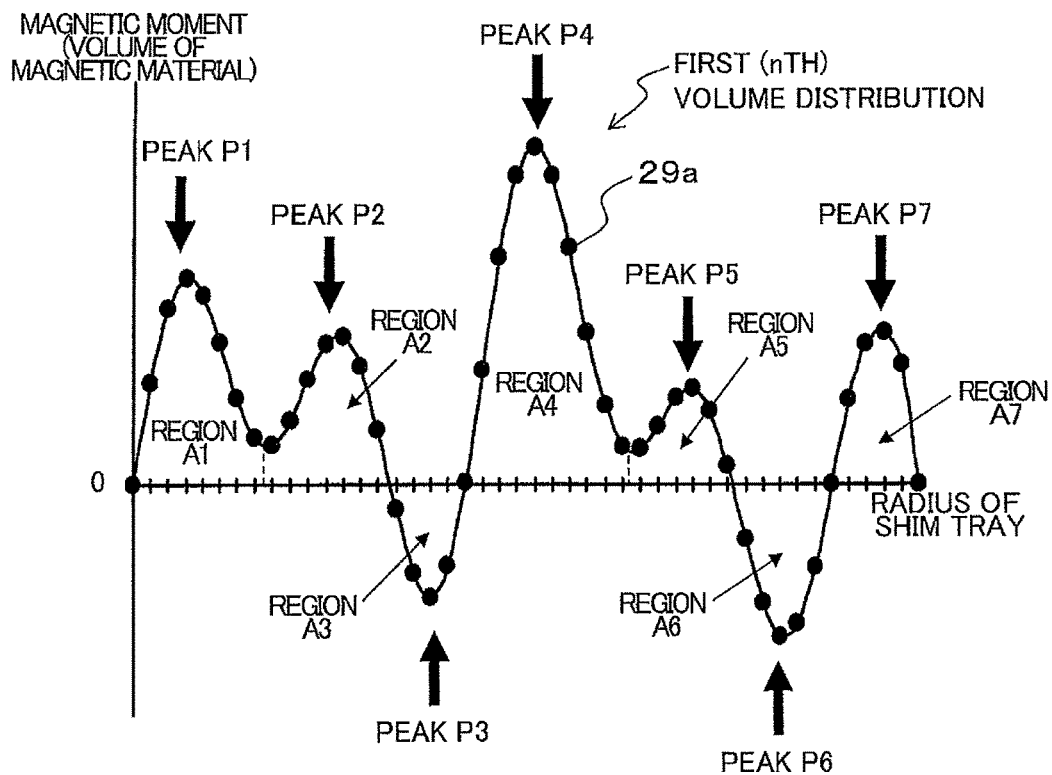
FIG. 9A illustrates the first (nth) volume distribution on the radius of the shim tray, and is a schematic illustration for understanding a concept of a region in which a peak position and a volume are multiplied.
Figure 9B:
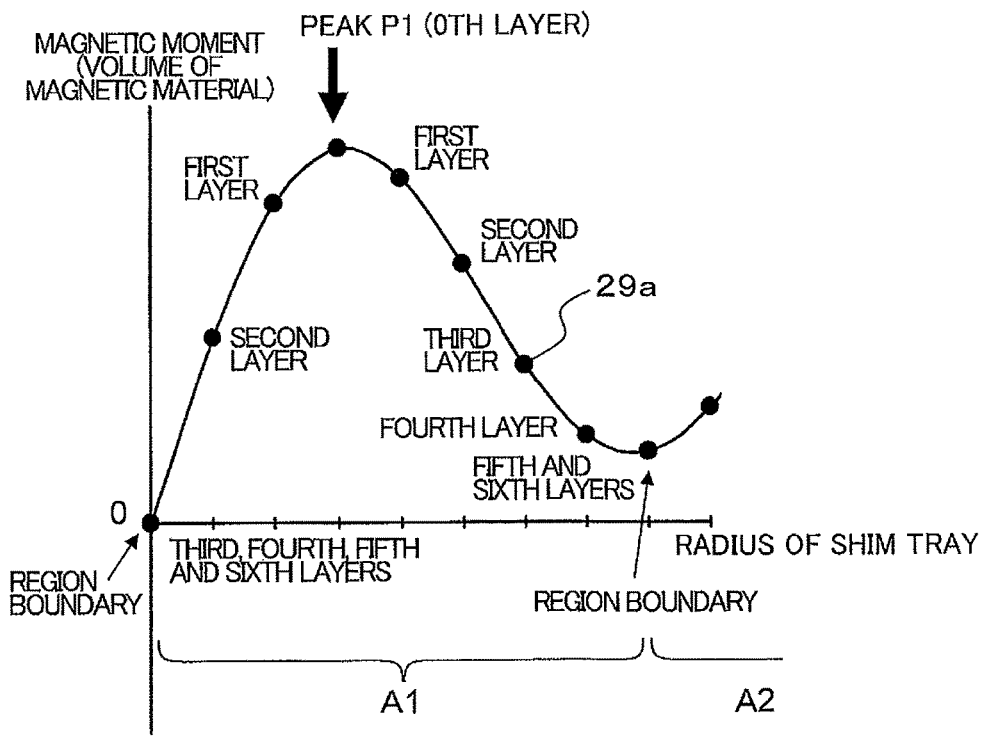
FIG. 9B illustrates the first (nth) volume distribution in a portion of the radius of the shim tray, and is a schematic illustration for understanding an algorithm for determining a region where volumes are multiplied starting at the peak position.

FIG. 9A illustrates the first (nth) volume distribution on the radius of each of the shim trays 17, 18 in the same manner as FIG. 7B, and FIG. 9B illustrates an enlarged view of a portion of the first (nth) volume distribution. As illustrated in FIG. 9A, the first (nth) volume distribution exhibits peaks (local maximum values or local minimum values) P1 to P7 (Pn) at any of the nodes 29a. Therefore, first, the nodes 29a indicating the peaks (local maximum values or local minimum values) P1 to P7 (Pn) are extracted. Then, as illustrated in FIG. 9B, starting at the node 29a indicating the peak P1 (Pn), a range in which a predetermined relationship of the magnetic moment (volume of the magnetic material) is satisfied between the adjacent nodes 29a (between a 0th (nth) layer and a first ((n+1)th) layer) is determined as a region A1 (An, A). The adjacent node 29a which does not satisfy the predetermined relationship is set as a region boundary of the region A1 (An, A). Thereby, the position of the node 29a indicating the peak P1 (Pn) is arranged substantially at a center of the region A1 (An, A). FIGS. 9A and 9B are one-dimensional schematic representations illustrating in outline the method for determining the region A; when this is expanded to the nodes 29a of the actual two-dimensional computational grids 29, the following is obtained.

First, all peaks Pn are extracted from the magnetic moment distribution (first (nth) volume distribution). When the magnetic moment at a certain node i is defined as $m_i$ and the magnetic moment at all adjacent nodes j corresponding to the node i is defined as $m_j$, if a relationship represented as Equation (12) is established for all the adjacent nodes j, the node i is the peak Pn.

$$m_i > m_j > 0 \text{ or } m_i < m_j < 0 \quad (12)$$

Then, starting at a node corresponding to each peak Pn, the value of the magnetic moment at the adjacent nodes is examined, while the boundary of the region An is determined. The boundary of the region An is determined to satisfy the following predetermined relationship.

(1) The node corresponding to the peak Pn is defined as a 0th layer.

(2) Among all adjacent nodes at a certain node k belonging to an nth layer, a set of the remaining nodes exclusive of nodes already defined as the nth layer or other layers is defined as C.

(3) If the node corresponding to the peak Pn has a positive magnetic moment for all nodes o belonging to the set C of the nodes and has a relationship with the nodes o as represented as Equation (13), the nodes o are defined as an (n+1)th layer. Moreover, if the node corresponding to the peak Pn has a negative magnetic moment for the nodes o and has a relationship with the nodes o as represented as Equation (14), the nodes o are defined as the (n+1)th layer. When the node o which does not satisfy these conditions, even if one, is present, the node k rather than the node o is redefined as the $(n_+1)$th layer.

$$0 < m_k < m_o \text{ or } m_o < 0 \quad (13)$$

$$m_o < m_k < 0 \text{ or } m_o > 0 \quad (14)$$

(4) (2) and (3) are repeated until a condition such that all nodes belonging to the nth layer are redefined as the $(n_+1)$th layer is obtained.

(5) A node group which finally forms the outermost layer is the boundary of the region An (region boundary). By the above, the region An (A) corresponding to the peak Pn is determined.

The above is (1) the modified method for determining the region An (A) as the composite region by the physical quantity (volume) composite calculation. (2) Obtaining the in-region volume $V_A$ calculated by adding together the volumes $V_i$ of the shim bolts 27 corresponding to the nodes 29a (screw holes 26) present in each region A (An), and the first (nth) composite distribution indicating the position for each region A (An), following after (1), can use the algorithm as it is. Incidentally, the position of the node 29a corresponding to the peak Pn can be set as the position of the region A (An).

Figure 10A:
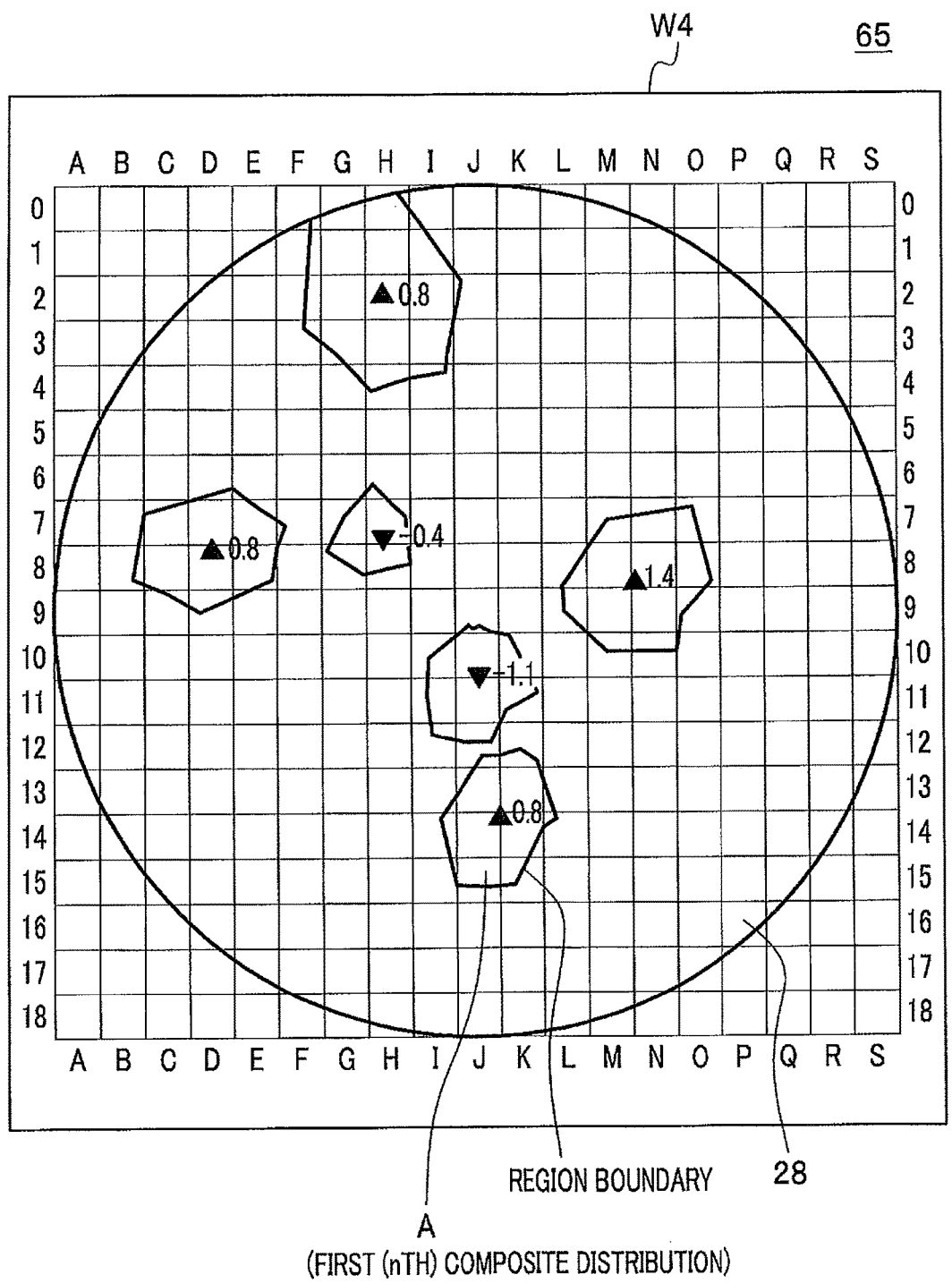
FIG. 10A illustrates a window which displays the first (nth) composite distribution.

Moreover, in the physical quantity (volume) composite calculation of step S5, the method for determining the region An (A) as the composite region, indicated by (1), is modified, and thereby, the first (nth) composite distribution displayed at step S6 changes as illustrated in FIG. 10A. As illustrated in FIG. 10A, the first (nth) composite distribution is displayed on the display device 65 or is outputted to the output device 64. When the first (nth) composite distribution is displayed on the display device 65, a multi-window is provided on the screen of the display device 65, the first (nth) composite distribution is displayed on one window W4 of the multi-window. The first (nth) composite distribution is represented by superimposing and displaying display of the region A divided by the region boundary and displays of the position of the corresponding region A (position of the node 29a corresponding to the peak Pn) and the in-region volume $V_A$ on displays of contour lines of the (orthogonal) grids 28 and the shim tray 17 (18). Incidentally, the in-region volume $V_A$ or marks ▲ and ▼ are represented at the position of the region A (the position of the node 29a corresponding to the peak Pn). The mark ▲ is represented when the in-region volume $V_A$ is positive, and the mark ▼ is represented when the in-region volume $V_A$ is negative. The mark represented when the in-region volume $V_A$ is positive is different from that represented when the in-region volume $V_A$ is negative, and thereby, the addition or removal of the shim bolts 27 can be easily identified. Moreover, preferably, coordinates (A, 0) to (S, 18) capable of identifying the grids are displayed at the (orthogonal) grids 28. Thereby, the operator can easily determine the position of the region A (position of the node 29a corresponding to the peak Pn). Moreover, the windows W1 to W4 can be selectively displayed or be displayed side by side.

Then, at step S7 of FIG. 5, the computer 62 determines whether or not a predetermined number of magnetic field adjustment calculations of step S1 has been performed. Two or more is set as the predetermined number. Description will be given later taking an instance where two is set as the predetermined number. In the above description, the magnetic field adjustment calculation of step S1 is performed only once, and thus, the predetermined number of magnetic field adjustment calculations, or two magnetic field adjustment calculations, is not performed (No at step S7), and the operation goes to step S8.

Then, at step S8, the computer 62 calculates a virtual magnetic field strength distribution formed in the magnetic field space 3 by the first (nth) composite distribution. The first (nth) composite distribution is formed of a combination of the coordinate (position of the node 29a corresponding to the peak Pn) and the in-region volume $V_A$ of the shim bolt 27 to be arranged at the position, and thus, a magnetic field strength distribution (virtual magnetic field strength distribution) formed in the magnetic field space 3 by the first (nth) composite distribution can be simply calculated.

Then, at step S9, the computer 62 calculates a second ((n+1)th) magnetic field strength distribution by adding together the first (nth) magnetic field strength distribution and the virtual magnetic field strength distribution. The virtual magnetic field strength distribution is represented as Equation (15). As represented by Equation (16), when the virtual magnetic field strength distribution is added to the first (nth) magnetic field strength distribution (Equation (7)) to assume that the first (nth) composite distribution is arranged on the shim trays 17, 18 and the magnetic field strength in the magnetic field space 3 is measured, a magnetic field strength distribution (second ((n+1)th) magnetic field strength distribution) which can be measured is determined by calculation.

$$\vec{b}_c \quad (15)$$

$$\vec{b}_1 = \vec{b}_m + \vec{b}_c \quad (16)$$

Then, the operation returns to step S3, and the computer 62 performs another magnetic field adjustment calculation. Specifically, the second magnetic field strength distribution calculated at step S9 is used as the input value for this calculation, although the first magnetic field strength distribution is used as the input value for the previous calculation. Thereby, a new magnetic field distribution to be generated is calculated from a difference from a target homogeneous magnetic field distribution, based on the second magnetic field strength distribution, as represented by Equation (17) in the same manner as Equation (8).

$$\vec{b}' = \vec{b}_u - \vec{b}_1 \quad (17)$$

Equation (5) is used for the new magnetic field distribution to be generated to set the output value, and a second (nth) volume distribution (magnetic moment distribution) indicating the positions and volumes of the shim bolts (magnetic materials) 27 to be arranged on the shim trays 17, 18 is calculated in order to homogenize the second magnetic field strength distribution.

The second (nth) volume distribution calculated at step S3 is displayed at step S4, and the second (nth) composite distribution is obtained at step S5 and is displayed at step S6. In other words, a combination of the position of the region A (position of the node 29a corresponding to the peak Pn) and the in-region volume $V_A$ is determined as the second (nth) composite distribution.

Then, at step S7, the computer 62 determines whether or not a predetermined number of magnetic field adjustment calculations of step S1 has been performed. Although description is given taking an instance where the predetermined number is set to two as mentioned previously, the calculation is performed this time and thereby two magnetic field adjustment calculations of step S1 are performed (Yes at step S7), and thus, the operation goes to step S10.

Figure 10B:
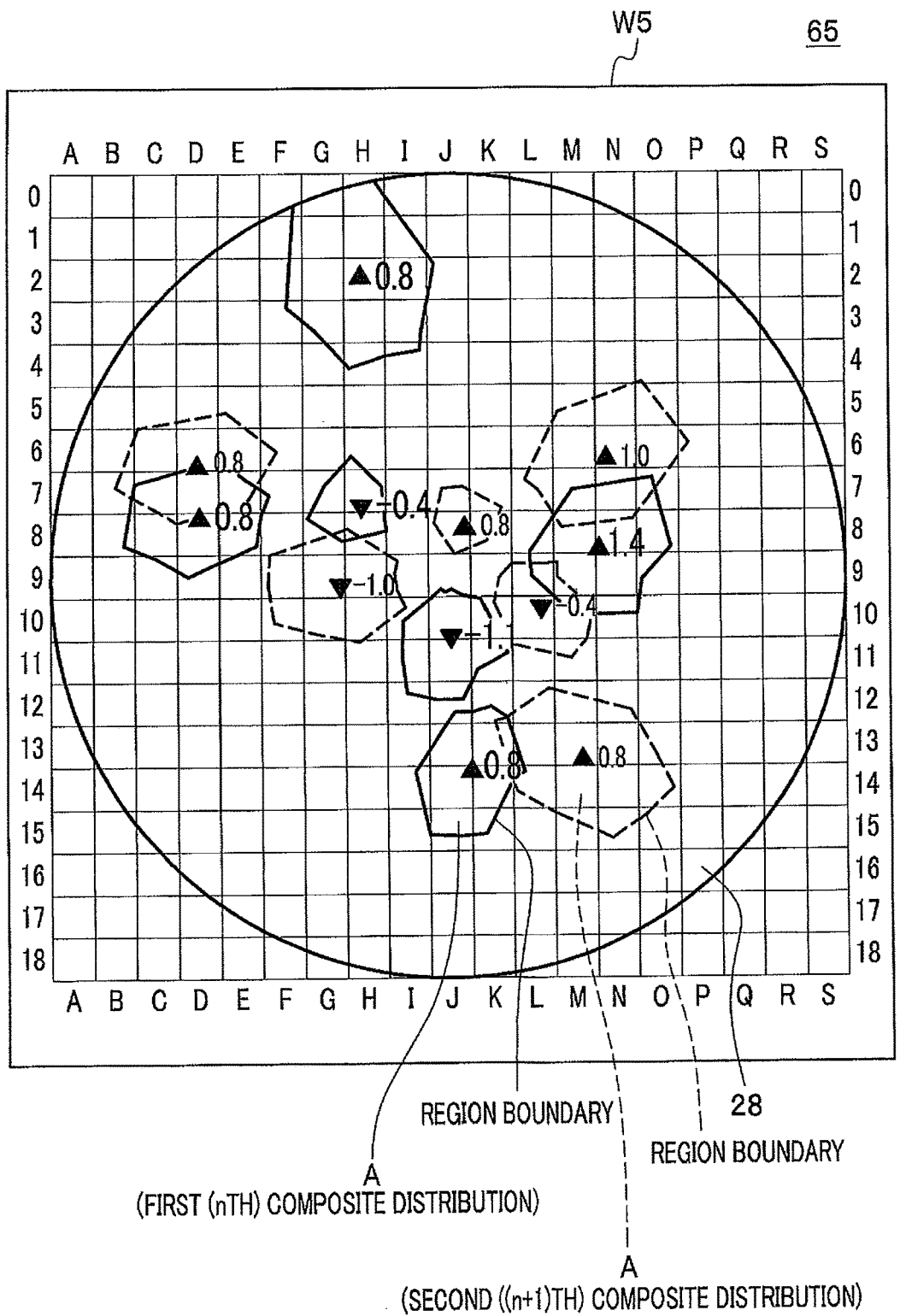
FIG. 10B illustrates a window which superimposes and displays the first (nth) volume distribution and a second ((n+1)th) composite distribution.

At step S10, as illustrated in FIG. 10B, the computer 62 recognizably displays the plural first to second ((n$_+$1)th) composite distributions. The plural first to second ((n$_+$1)th) composite distributions are displayed on the display device 65 or are outputted to the output device 64. When the plural first to second ((n$_+$1)th) composite distributions are displayed on the display device 65, a multi-window is provided on the screen of the display device 65, the plural first to second ((n$_+$1)th) composite distributions are displayed on one window W5 of the multi-window. The plural first to second ((n$_+$1)th) composite distributions are represented by display of the region A divided by the region boundary and displays of the position of the corresponding region A (position of the node 29a corresponding to the peak Pn; corresponding to the display positions of the marks ▲ and ▼ and the in-region volume $V_A$. The plural first to second ((n$_+$1)th) composite distributions are superimposed and displayed on displays of contour lines of the (orthogonal) grids 28 and the shim tray 17 (18). According to a procedure of calculation, the first (nth) composite distribution is relatively larger in calculated in-region volume $V_{An}$ than the second ((n+1)th) composite distribution and thus has a higher degree of importance for magnetic field homogeneity adjustment operation. Therefore, desirably, the in-region volume $V_{An}$ of the first (nth) composite distribution can be distinguished from the second ((n+1)th) composite distribution by changing a display color or font or by changing the type of line of the region boundary of the region A. Further, the window W4 on which the first (nth) composite distribution is displayed as illustrated by way of example in FIG. 10A is provided, while a window on which the second ((n+1)th) composite distribution is displayed may be provided. The windows W4, W5 can be selectively displayed or displayed side by side on the display device 65. Moreover, the windows W4, W5 may be displayed together with the windows W1 to W3.

At step S11, the operator arranges the shim bolts 27 on the shim trays 17, 18 according to the display. Specifically, the shim bolts 27 corresponding to the in-region volumes $V_{An}$, of the plural first to second ((n$_+$1)th) composite distributions are arranged at the corresponding positions on the shim trays 17, 18, based on the positions of the regions A of the plural first to second ((n+1)th) composite distributions (the positions of the nodes 29a corresponding to the peaks Pn) and the in-region volume $V_{An}$. Assuming that the shim bolts 27 are arranged on the shim trays 17, 18 for the first (nth) composite distribution, the second ((n+1)th) composite distribution corresponds to a calculated result of a composite distribution to be required next, and thus, the operator can simultaneously arrange the first (nth) composite distribution and the second ((n+1)th) composite distribution on the shim trays 17, 18, and substantially, two arrangement operations for the shim bolts 27 can be performed by a single operation.

The operator can obtain the effect of substantially two magnetic field homogeneity adjustment operations by arranging the shim bolts 27 at 12 locations for example in an example of FIG. 10B (it is obvious that the number of locations, 12, is given merely by way of example in FIG. 10B and varies according to circumstances in the actual magnetic field homogeneity adjustment operation), and operation efficiency is improved as compared to a case where the shim bolts 27 are arranged based on a single calculated result (first (nth) composite distribution alone). Moreover, a magnet device using such a method and a magnetic resonance imaging apparatus using the magnet device can reduce the time required for installation adjustment, and consequently, an inexpensive device can be provided.

In the above-described example, the approach of determining the first and second composite distributions, or equivalently, repeating substantially two calculations, is given by way of example; however, it is clear that the number of procedures for calculating the composite distribution is not necessarily limited to two, and three or more calculations may be performed (first and second composite distributions may be determined).

Incidentally, the above-described approach is effective in reducing the number of operations; however, the region An and the region boundary are approximately determined, and thus, plural magnetic field homogeneity adjustment operations are repeatedly performed in order to increase the accuracy of magnetic field homogeneity adjustment. Moreover, in the process of repeating, if switching between the displays of FIGS. 8A and 8B and the displays of FIGS. 10A and 10B can be arbitrarily performed, the operator can proceed the operation while appropriately changing a detailed arrangement of shim bolts as illustrated in FIGS. 8A and 8B and a so-called rough arrangement of shim bolts as illustrated in FIGS. 10A and 10B. Incidentally, the displays of FIGS. 8A and 8B provide the in-region volume $V_{An}$ of the plural first to second ((n+1)th) composite distributions in the region A; however, if the displays are complicated, the in-region volume $V_{An}$ obtained by summing for each region A may be displayed.

Then, the operation returns to step S1, and the data acquisition calculator 61 or the operator uses the magnetic probe 63 to measure again a magnetic field strength distribution (first magnetic field strength distribution) in the magnetic field space 3.

Then, at step S2, the computer 62 determines whether or not the first magnetic field strength distribution satisfies the homogeneous magnetic field specification. If the first magnetic field strength distribution satisfies the homogeneous magnetic field specification (Yes at step S2), the flowchart of the magnetic field homogeneity adjustment method is brought to an end. If the first magnetic field strength distribution does not satisfy the homogeneous magnetic field specification (No at step S2), the operation goes to step S3. For example, if the first magnetic field strength distribution satisfies the homogeneous magnetic field specification by the arrangement of the shim bolts 27 at step S11, the magnetic field homogeneity adjustment method is brought to an end.

(Second Embodiment)

FIG. 11 illustrates a screen of the display device 65 which displays together plural windows W6 to W8 which display plural first to third composite distributions in a magnetic field homogeneity adjustment method according to a second embodiment of the present invention. The second embodiment is different from the first embodiment in that the second embodiment displays the plural first to third composite distributions in a table. The coordinates of the arrangement positions (the regions A) and the volumes (the in-region volumes) $V_{An}$ of the plural first to third composite distributions are displayed in tabular form. Moreover in the second embodiment, it is desirable that to which of the first to third composite distributions the displayed volume corresponds to can be identified. In the second embodiment, the first to third composite distributions are displayed in different tables. Besides the different tables, for example, a method in which colors or fonts which display the coordinates of the arrangement positions (regions A) and the volumes (in-region volumes) $V_{An}$ of the plural first to third composite distributions are different may be used. Thus, if the arrangement positions (coordinates) and the volumes (in-region volumes) $V_{An}$ of the shim bolts 27 are clear even without depending on images, the substance of adding (multiplying) the volume distributions on the shim trays 17, 18 does not change, and thus, the number of shim bolts 27 to be arranged can be reduced, and the number of arrangements (magnetic field homogeneity adjustments) of the shim bolts 27 can also be reduced, and thus, ease of operation can be greatly enhanced.

(Third Embodiment)

Figure 12:
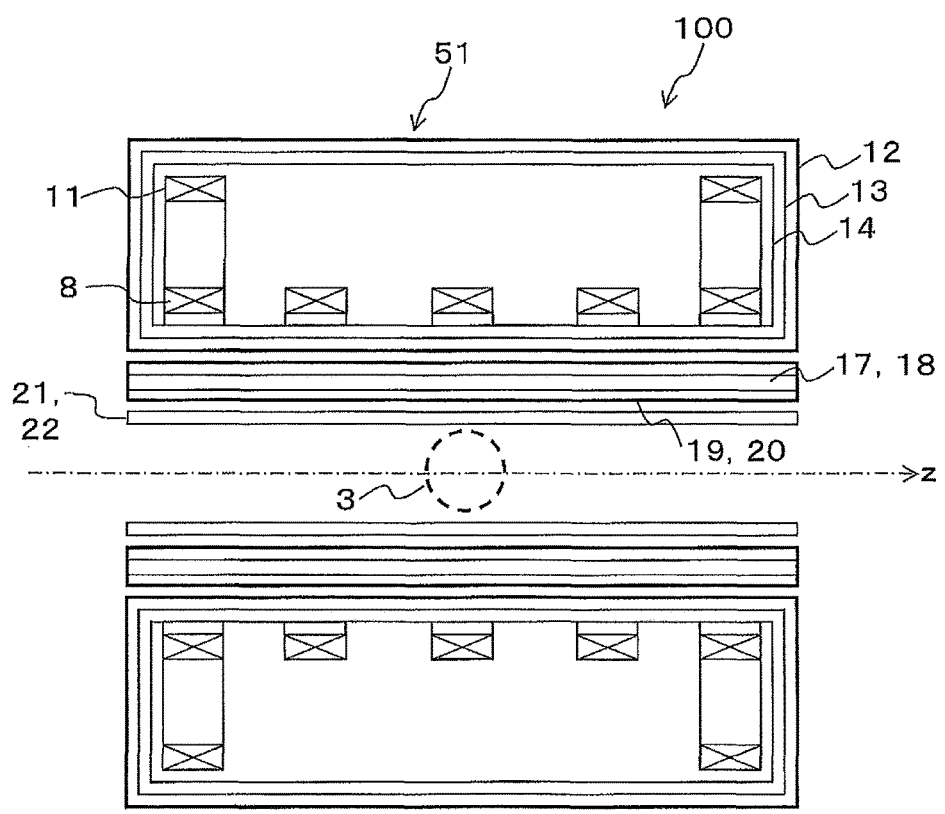
FIG. 12 is a longitudinal sectional view of a magnetic resonance imaging apparatus according to a third embodiment of the present invention.

FIG. 12 illustrates a longitudinal sectional view of the magnetic resonance imaging apparatus 100 according to a third embodiment of the present invention. The magnet device 50 (see FIG. 1) of the first embodiment generates a vertical magnetic field in the magnetic field space 3 by the magnetic poles vertically arranged facing each other, whereas a magnet device 51 of the third embodiment is different from the magnet device 50 in that the magnet device 51 generates a horizontal magnetic field in the magnetic field space 3 by the double cylindrical vacuum container 12 whose central axis coincides with a z axis, the radiation shield 13, and a group of the superconducting coils 8, 11 contained in the helium container 14. As illustrated in FIG. 12, the magnet device 51 has a configuration in which the gradient magnetic field coil 19 (20) is arranged on an inner periphery of the double cylindrical vacuum container 12, and the shim tray 17 (18) is contained in the gradient magnetic field coil 19 (20). The configuration is merely illustrative, and the shim tray 17 (18) may be arranged on an inner peripheral side of the gradient magnetic field coil 19 (20) or may be arranged on an outer peripheral side thereof.

Figure 13:
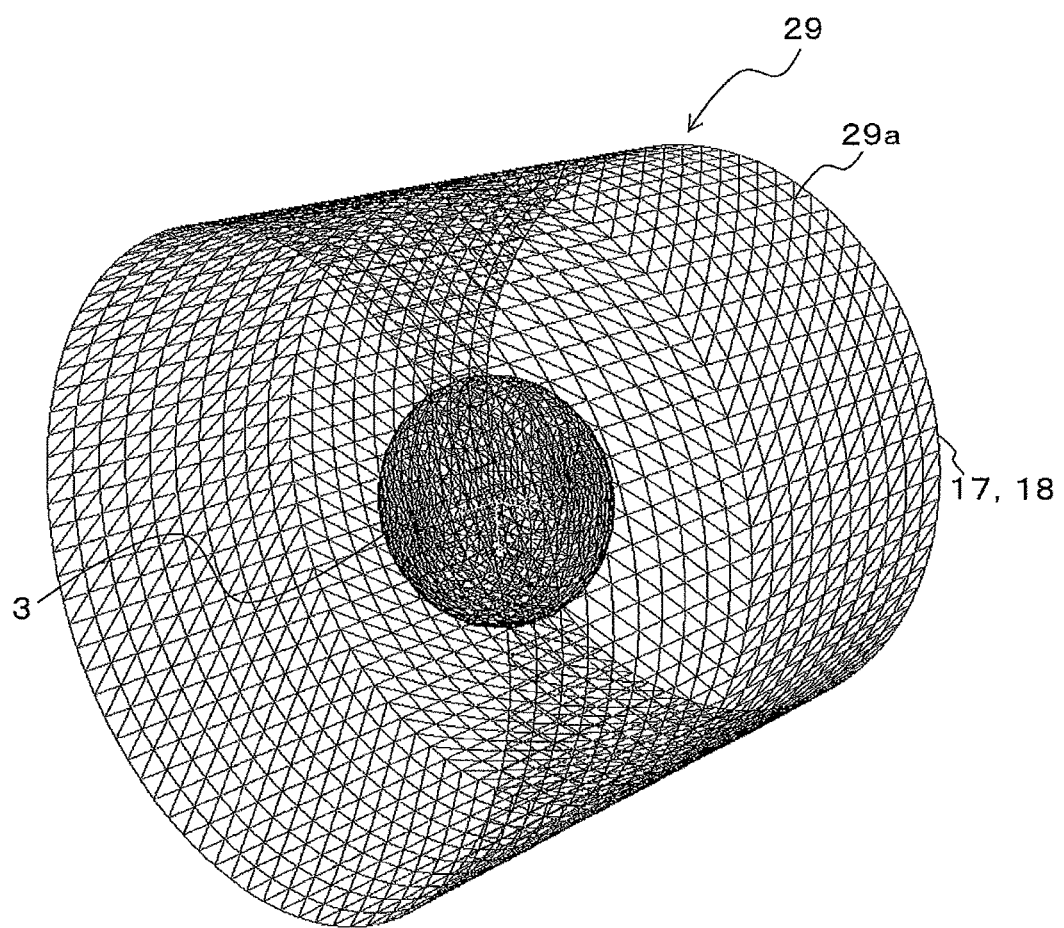
FIG. 13 is a perspective view of an example of computational grids for calculating a first volume distribution of shim bolts (magnetic materials), corresponding to a magnet device according to the third embodiment of the present invention.

FIG. 13 illustrates a perspective view of an example of the computational grid 29 for calculating the first volume distribution of the shim bolts (magnetic materials), corresponding to the magnet device 51 according to the third embodiment of the present invention. As illustrated in FIG. 12, the computational grid 29 is arranged in such a manner that the shim tray 17 (18) contained in the gradient magnetic field coil 19 (20) surrounds the spherical magnetic field space 3. The computational grid 29 enables performing calculation in the same manner as the first embodiment and also performing magnetic field homogeneity adjustment operation on the magnet device 51 in quite the same manner as the first embodiment, and also enables improving the operation efficiency. Incidentally, FIG. 13 illustrates an instance where the shim tray 17 (18) has a cylindrical shape; however, the shim tray 17 (18) is not limited to having a circular shape in cross section but may have a non-circular shape in cross section, such for example as an elliptical shape, depending on the shape of the gradient magnetic field coil 19 (20).

REFERENCE SIGNS LIST

1 Upper coil container
2 Lower coil container
3 Magnetic field space (Homogeneous magnetic field space, Imaging space)
4, 5 Connecting column
8, 9 Main coils (Magnetic field generation source)
10, 11 Shielding coils (Magnetic field generation source)
12 Vacuum container
13 Radiation shield
14 Helium container
15, 16 Recessed portion of vacuum container
17, 18 Shim tray (Magnetic field homogeneity adjustment means)
19, 20 Gradient magnetic field coil
21, 22 RF transmitting and receiving coil
26 Screw hole
27 Magnetic material (Shim bolt, Magnetic material shim, Magnetic field homogeneity adjustment means)
28 Grid (Orthogonal grid)
29 Computational grid
29a Node of computational grid
50, 51 Magnet device
62 Magnetic field homogeneity adjustment device (Computer)
100 Magnetic resonance imaging apparatus
A Region
W0 Multi-window
W1 Window
S Magnetic pole face

The invention claimed is:

1. A magnetic field homogeneity adjustment method for a magnet device including a magnetic field generation source which generates a magnetic field space, and magnetic field homogeneity adjustment means for homogenizing a first magnetic field strength distribution in the magnetic field space by arranging a plurality of magnetic materials on an outer side of the magnetic field space, the method for calculating and displaying a first volume distribution representing positions and volumes of the magnetic materials to be arranged on the magnetic field homogeneity adjustment means, in order to homogenize the first magnetic field strength distribution, based on the first magnetic field strength distribution, wherein the method comprises steps executed by a computer of:

dividing the magnetic field homogeneity adjustment means into a plurality of regions, and acquiring a first composite distribution representing an in-region volume obtained by adding together the volumes of the magnetic materials located in each of the regions, based on the first volume distribution, and the positions of the regions;

calculating a virtual magnetic field strength distribution created in the magnetic field space by the magnetic materials supposed to be arranged as in the first composite distribution;

calculating a second magnetic field strength distribution obtained by adding together the first magnetic field strength distribution and the virtual magnetic field strength distribution;

calculating a second volume distribution representing the positions and volumes of the magnetic materials to be arranged on the magnetic field homogeneity adjustment means, in order to homogenize the second magnetic field strength distribution, based on the second magnetic field strength distribution;

acquiring a second composite distribution representing an in-region volume obtained by adding together the volumes of the magnetic materials located in each of the regions, based on the second volume distribution, and the positions of the regions; and displaying the positions of the regions and the in-region volumes of the magnetic materials in the first composite distribution and the second composite distribution, respectively.

2. The magnetic field homogeneity adjustment method according to claim 1, wherein the positions of the regions and the in-region volumes are displayed distinguishably for the first composite distribution and the second composite distribution.

3. The magnetic field homogeneity adjustment method according to claim 1, wherein the positions of the regions and the in-region volumes are displayed by using different fonts for the first composite distribution and the second composite distribution.

4. The magnetic field homogeneity adjustment method according to claim 1, wherein the positions of the regions and the in-region volumes are displayed by using different colors for the first composite distribution and the second composite distribution.

5. The magnetic field homogeneity adjustment method according to claim 1, wherein the positions of the regions and the in-region volumes are displayed by using different graphical and tabular representations for the first composite distribution and the second composite distribution.

6. The magnetic field homogeneity adjustment method according to claim 1, wherein the positions of the regions and the in-region volumes are displayed on a multi-window and are displayed on different windows for the first composite distribution and the second composite distribution.

7. The magnetic field homogeneity adjustment method according to claim 1, wherein the magnet device has upper and lower magnetic pole faces vertically facing each other and generates the magnetic field space having a magnetic field in a vertical direction between the magnetic pole faces.

8. The magnetic field homogeneity adjustment method according to claim 7, wherein
the magnetic field homogeneity adjustment means has disc-shaped shim trays made of non-magnetic materials arranged on the magnetic pole faces, and
the magnetic materials are arranged on the shim trays.

9. The magnetic field homogeneity adjustment method according to claim 1, wherein
the dividing of the magnetic field homogeneity adjustment means into the plurality of regions
divides the magnetic field homogeneity adjustment means in such a manner that the regions include a position at which the first volume distribution or the second volume distribution has a local maximum value or a local minimum value, or divides the magnetic field homogeneity adjustment means into the regions divided by a predetermined grid.

10. The magnetic field homogeneity adjustment method according to claim 9, wherein
the positions of the regions
are each set at the position at which the local maximum value or the local minimum value exists, or
are each set at a predetermined position in each of the regions divided by the predetermined grid.

11. The magnetic field homogeneity adjustment method according to claim 1, wherein
the calculating of the first volume distribution or the second volume distribution sets the positions of nodes of a computational grid as the positions of the magnetic materials, and calculates the volume of the magnetic material at each of the nodes, and
the dividing of the magnetic field homogeneity adjustment means into the plurality of regions sets as a starting point the position of the node at which the first volume distribution or the second volume distribution has the local maximum value or the local minimum value, and sequentially sets as the region a range in which a predetermined relationship of the volume is satisfied between the adjacent nodes.

12. The magnetic field homogeneity adjustment method according to claim 1, wherein the step of displaying the positions of the regions and the in-region volumes in the first composite distribution and the second composite distribution displays the in-region volumes at positions corresponding to the positions of the regions in an image representing the magnetic field homogeneity adjustment means.

13. The magnetic field homogeneity adjustment method according to claim 12, wherein
the in-region volume,
if having a positive value, indicates that the number of the magnetic materials to be arranged on the magnetic field homogeneity adjustment means is to be increased, and
if having a negative value, indicates that the number of the magnetic materials to be arranged on the magnetic field homogeneity adjustment means is to be reduced, and
the step of displaying the positions of the regions and the in-region volumes in the first composite distribution and the second composite distribution displays different marks according to whether the in-region volume has a positive value or a negative value, at the positions corresponding to the positions of the regions in the image representing the magnetic field homogeneity adjustment means.

14. A magnet device, comprising:
a magnetic field generation source which generates a magnetic field space; and
a magnetic field homogeneity adjustment means for homogenizing a first magnetic field strength distribution in the magnetic field space by arranging a plurality of magnetic materials on an outer side of the magnetic field space,
a computer programmed to execute:
calculating and displaying a first volume distribution representing positions and volumes of the magnetic materials to be arranged on the magnetic field homogeneity adjustment means, in order to homogenize the first magnetic field strength distribution, based on the first magnetic field strength distribution
dividing the magnetic field homogeneity adjustment means into a plurality of regions, and acquiring a first composite distribution representing an in-region volume obtained by adding together the volumes of the magnetic materials located in each of the regions, based on the first volume distribution, and the positions of the regions;
calculating a virtual magnetic field strength distribution created in the magnetic field space by the magnetic materials supposed to be arranged as in the first composite distribution;
calculating a second magnetic field strength distribution obtained by adding together the first magnetic field strength distribution and the virtual magnetic field strength distribution;
calculating a second volume distribution representing the positions and volumes of the magnetic materials to be arranged on the magnetic field homogeneity adjustment means, in order to homogenize the second magnetic field strength distribution, based on the second magnetic field strength distribution;
acquiring a second composite distribution representing an in-region volume obtained by adding together the volumes of the magnetic materials located in each of the regions, based on the second volume distribution, and the positions of the regions,
wherein the in-region volumes in the first composite distribution and the second composite distribution are arranged at positions on the magnetic field homogeneity adjustment means, corresponding to the positions of the regions in the first composite distribution and the second composite distribution, based on the positions of the regions and the in-region volumes in the first composite distribution and the second composite distribution.

15. A magnetic resonance imaging apparatus, comprising the magnet device according to claim 14 mounted thereon.

* * * * *